United States Patent
Kimura

(10) Patent No.: US 6,323,100 B1
(45) Date of Patent: Nov. 27, 2001

(54) METHOD FOR MANUFACTURING A SEMICONDUCTOR DEVICE

(75) Inventor: Atsushi Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/460,115

(22) Filed: Dec. 13, 1999

Related U.S. Application Data

(62) Division of application No. 09/075,817, filed on May 12, 1998, now Pat. No. 6,118,144.

(30) Foreign Application Priority Data

May 12, 1997 (JP) .................................................. 9-120519

(51) Int. Cl.$^7$ .................................................. H01L 21/20
(52) U.S. Cl. ......................... 438/397; 438/396; 438/253; 438/744
(58) Field of Search .................... 438/397, 396, 438/253, 254, 718, 724, 734, 735, 744–745, 778, 255, 398

(56) References Cited

U.S. PATENT DOCUMENTS

| 5,082,797 | * | 1/1992 | Chan et al. ........................ 438/255 |
| 5,150,276 |   | 9/1992 | Gonzalez et al. . |
| 5,164,881 |   | 11/1992 | Ahn . |
| 5,389,568 |   | 2/1995 | Yun . |
| 5,796,138 |   | 8/1998 | Chao . |

FOREIGN PATENT DOCUMENTS

| 5-67747  | 3/1993  | (JP) . |
| 5-267614 | 10/1993 | (JP) . |
| 6-204428 | 7/1994  | (JP) . |

* cited by examiner

*Primary Examiner*—Charles Bowers
*Assistant Examiner*—Yennhu B. Huynh
(74) *Attorney, Agent, or Firm*—Sughrue, Mion, Zinn, Macpeak & Seas, PLLC

(57) ABSTRACT

In a semiconductor memory having a cylindrical storage electrode which is electrically connected to a semiconductor substrate through a contact hole formed to penetrate through an insulating film formed on the semiconductor substrate, the cylindrical storage electrode has a horizontal fin formed integrally with the cylindrical storage electrode and to extend inwardly from an inner surface of the cylindrical storage electrode to form an annular ring extending along the inner circumference of the cylindrical storage electrode one turn. A dielectric film is formed to cover a surface of the cylindrical storage electrode including the surface of the horizontal fin, and is covered with a plate electrode. Thus, the cylindrical storage electrode has an increased effective surface area even if the area per memory cell is reduced. Accordingly, a necessary storage capacitance can be obtained with an increased integration density.

5 Claims, 18 Drawing Sheets

METHOD FOR MANUFACTURING A SEMICONDUCTOR DEVICE

This is a divisional of application Ser. No. 09/075,817 filed May 12, 1998, now U.S. Pat. No. 6,118,144 the disclosure of which is incorporated herein by reference.

BACKGROUND OF THE INVENTION

1. Field of the Invention

The present invention relates to a method for manufacturing a semiconductor device, and more specifically to a storage electrode of the capacitor structure in a semiconductor memory such as a DRAM (dynamic random access memory) and a method for forming the same.

2. Description of Related Art

With advancement of the semiconductor device manufacturing technology, the integration density of the DRAM is increasing more and more and the microfabrication of the DRAM is advancing more and more. This can be realized by reducing the area per memory cell, since an array of memory cells occupies a major portion of the area of a chip. However, when the area per memory cell is reduced, a storage capacitance of each memory cell for storing data is correspondingly reduced.

As means for increasing the storage capacitance in a limited area for a unitary memory cell for the purpose of overcoming the above mentioned problem, it is a general practice to increase a surface area of a storage electrode (lower electrode) of the capacitor. For increasing the surface area, a stacked capacitor, a trench capacitor, and a stacked-and-trench combined capacitor have been proposed. Among these proposed capacitors, since the stacked capacitor can be formed by a forming method which is simpler than that for forming the trench capacitor, much research has been conducted form the stacked capacitor.

However, in the DRAM consisting of 64 Mbits or more, a method of increasing the height of the storage electrode of a conventional simple three-dimensional stacked capacitor, for the purpose of obtaining a necessary surface area, has already lead to difficulties in ensuring sufficient capacitance. In addition, an absolute step difference (level difference) between a memory cell zone and a peripheral circuit zone becomes large, with the result that it is difficult to pattern a wiring conductor layer formed to extend over both the memory cell zone and the peripheral circuit zone, in particular, by a photolithography. Under this circumstance, various modified three-dimensional stacked capacitors have been proposed by JP-A-05-067747 and its corresponding U.S. Pat. No. 5,164,88, JP-A-06-204428 and its corresponding U.S. Pat. No. 5,389,568 and JP-A-05-267614 and its corresponding U.S. Pat. No. 5,150,276, the contents of which are incorporated by reference in their entirety into this application.

Among these proposed stacked capacitors, a stacked capacitor of a cylindrical structure for the DRAM, proposed by JP-A-06-204428 and U.S. Pat. No. 5,389,568, utilizes not only an inner wall surface but also an outer wall surface as a surface area, and therefore, is a structure suitable to a memory cell for a higher integration density memory.

Now, this structure will be described with reference to FIGS. 1A to 1H, which are diagrammatic sectional views for illustrating a semiconductor memory having a cylindrical structure stacked capacitor and a method for manufacturing the same.

As shown in FIG. 1A, a surface of a p-type silicon substrate 1 is divided into an active region and an inactive region by forming a field oxide film 2 on the surface of a p-type silicon substrate 1 by a conventional device isolation process. In the active region, a pair of transistors are formed to have a bit ling B and a drain region D formed under the bit ling B, in common to the pair of transistors. Each of the transistors has a source region S formed separately from the common drain region D and a gate electrode 3 formed on a gate insulator formed on a region between the common drain D and the individual source region S. The above mentioned elements are formed in a conventional semiconductor device manufacturing process.

Furthermore, in order to isolate the transistors thus formed, form a conducting layer which will be formed at a later step, an interlayer insulator film 4 is formed to cover the whole surface, and a BPSG (borophosphosilicate glass) film 5 is grown on the interlayer insulator film 4 by a low pressure CVD (chemical vapor deposition) or a atmospheric pressure CVD and a reflow processing is conducted.

Then, a silicon nitride film (SiN) film 6 is grown on the whole surface, and a capacitor contact hole 7 is formed at a position of a cell node of the memory cell by means of a photolithography and an anisotropic etching.

Succeedingly, as shown in FIG. 1B, a first polysilicon film 12 is deposited to cover the whole surface of the silicon nitride film 6 and the capacitor contact hole 7, and as shown in FIG. 1C, an NSG (non-doped silicate glass) film 12 is further deposited to completely fill the capacitor contact hole 7 and to cover an upper surface of the first polysilicon film 12. Then, a stacked structure composed of the NSG film 13 and the first polysilicon film 12 is patterned to the shape of a storage electrode of the stacked capacitor (cylindrical shape) as indicated by the arrow Y1.

Thereafter, as shown in FIG. 1E, a second polysilicon film 17 is deposited on the whole surface, and then, as shown in FIG. 1F, the whole surface is anisotropically etched so that a side wall 18 of the second polysilicon film 17 is formed on a side surface of the patterned stacked structure of the first polysilicon layer 12 and the NSG film 13.

Furthermore, as shown in FIG. 1G, only the NSG film 12 is removed by an ammon fluoride (ammonium fluoride) solution, so that a surface of the storage electrode composed of the patterned first polysilicon film 12 and the side wall 18 of the remaining second polysilicon 17, is exposed. Thus, the storage electrode designated by Reference Numeral 8 in FIG. 1H is formed, which is in contact with the silicon substrate 1 (specifically, the source region S) through the capacitor contact hole 7 and which extends in a horizontal direction on the upper surface of the silicon nitride film 6 (constituting the insulator film) and further extends in an upward vertical direction at an arbitrary position.

Thereafter, a dielectric material film 9 is formed on the whole surface, and then, a third polysilicon film is deposited on the whole surface as a plate electrode 10 of the stacked capacitor. Thus, the capacitor structure of the DRAM is completed.

Incidentally, JP-A-05-067747 and U.S. Pat. No. 5,164, 881 propose a structure in which a plurality of vertical holes are formed in the above mentioned storage electrode, and JP-A-05-267614 and U.S. Pat. No. 5,150,276 propose a structure in which two annular rings and a silicon vertical fin are formed in the above mentioned capacitor contact hole.

However, in the above mentioned prior art, the following problems have been encountered.

In the above mentioned stacked capacitor forming method proposed by JP-A-06-204428 and U.S. Pat. No. 5,389,568, in order to reduce the cell size and at the same time to increase the surface of the storage electrode 8 so as to increase the storage capacitance, it is sufficient if the side wall 18 is heightened. However, if the side wall 18 is heightened, the absolute step difference between the memory cell zone and the peripheral circuit zone becomes large, with the result that it becomes difficult to pattern a wiring layer formed to extend over both the memory cell zone and the peripheral circuit zone. In addition, the higher the side wall 18 is, the weaker the strength of the side wall 18 becomes, with the result that there occurs the possibility that the side wall 17 will collapse.

In the approach proposed by JP-A-05-067747 and U.S. Pat. No. 5,164,881, the surface area can be increased by a number of vertical holes, but when the side wall 18 is heightened in order to further increase the surface area, the absolute step difference between the memory cell zone and the peripheral circuit zone becomes large, and it becomes difficult to pattern an overlying wiring layer, similarly to the method proposed by JP-A-06-204428 and U.S. Pat. No. 5,389,568. On the other hand, in the approach proposed by JP-A-05-267614 and U.S. Pat. No. 5,150,276, since the storage electrode is accommodated in the capacitor contact hole, the storage capacitance cannot be made so large as the former two prior art examples.

SUMMARY OF THE INVENTION

Accordingly, it is an object of the present invention to provide a method for manufacturing a semiconductor device, which has overcome the above mentioned defects.

Another object of the present invention is to provide a storage electrode incorporated in the capacitor structure of a semiconductor memory, which can have a large storage capacitance without sacrificing the integration density and which can be formed by a simple forming process, and a method for forming the storage electrode.

The above and other objects of the present invention are achieved in accordance with the present invention by a semiconductor device comprising a semiconductor substrate, an insulating film formed on the semiconductor substrate, a storage electrode formed on the insulating film and being contacted with the semiconductor substrate through a contact hole formed to penetrate through the insulating film, a dielectric film formed to cover the surface of the storage electrode, and a plate electrode formed to cover the dielectric film, so that a capacitor is formed by the storage electrode and the plate electrode separated by the dielectric film, the storage electrode having a cylindrical portion having a projection extending from an inner surface of the cylindrical portion.

The projection can be formed integrally with the cylindrical portion. In addition, the projection can be formed to extend in an inwardly radial direction, and may include a plurality of projections. Furthermore, the projection can be in the form of a ring extending along the inner circumference of the cylindrical portion. Alternatively, the projection can be in the form of a fin. The projection may include a plurality of projections which are located separately from each other in a height or axial direction of the cylindrical portion. Furthermore, a predetermined spacing can be formed between the insulating film and the bottom surface of the storage electrode.

According to another aspect of the present invention, there is provided a method for manufacturing a semiconductor device, comprising the steps of forming a first insulating film on a semiconductor substrate, forming a second insulating film on the first insulating film, selectively removing the first insulating film and the second insulating film to form a contact hole to penetrate through the first insulating film and the second insulating film and to expose a portion of the semiconductor substrate, forming a first conducting layer on the whole surface including an inner surface of the contact hole, forming a multi-layer insulating film composed of at least three layers, on the whole surface of the first conducting layer, patterning a stacked structure composed of the first conducting layer and the multi-layer insulating film into a pillar form, selectively etching the patterned multi-layer insulating film to partially remove and retract an intermediate layer between an upper layer and a lower layer of the multi-layer insulating film so as to form a recess between the upper layer and the lower layer of the multi-layer insulating film, forming a second conducting layer on the whole surface including an inside of the recess, etching back the second conducting film by an anisotropic etching, so that a cylindrical side wall formed of the second conducting film is formed on a side surface of the patterned multi-layer insulating film having the recess, removing the multi-layer insulating film to form a storage electrode formed of the remaining first and second conducting layers, forming a dielectric film on a surface of the storage electrode, and forming a third conducting layer on the dielectric film as a plate electrode.

In the above process, the second insulating film can include a silicon nitride film. Alternatively, in the selective etching of the patterned multi-layer insulating film, the etch rate of the intermediate layer of the multi-layer insulating film can be higher than that of the other layers of the multi-layer insulating film.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the semiconductor memory in accordance with the present invention will be described with reference to the accompanying drawings.

First Embodiment

Figure 1A:
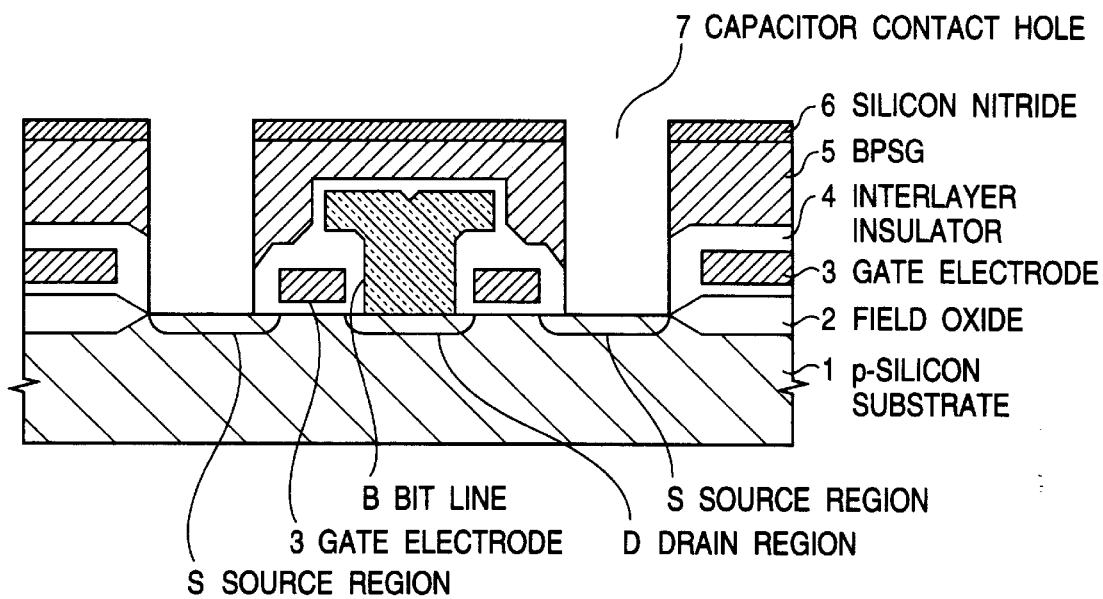
FIGS. 1A to 1H are diagrammatic sectional views for illustrating a method for manufacturing a semiconductor memory having a prior art cylindrical structure stacked capacitor.
Figure 1B:
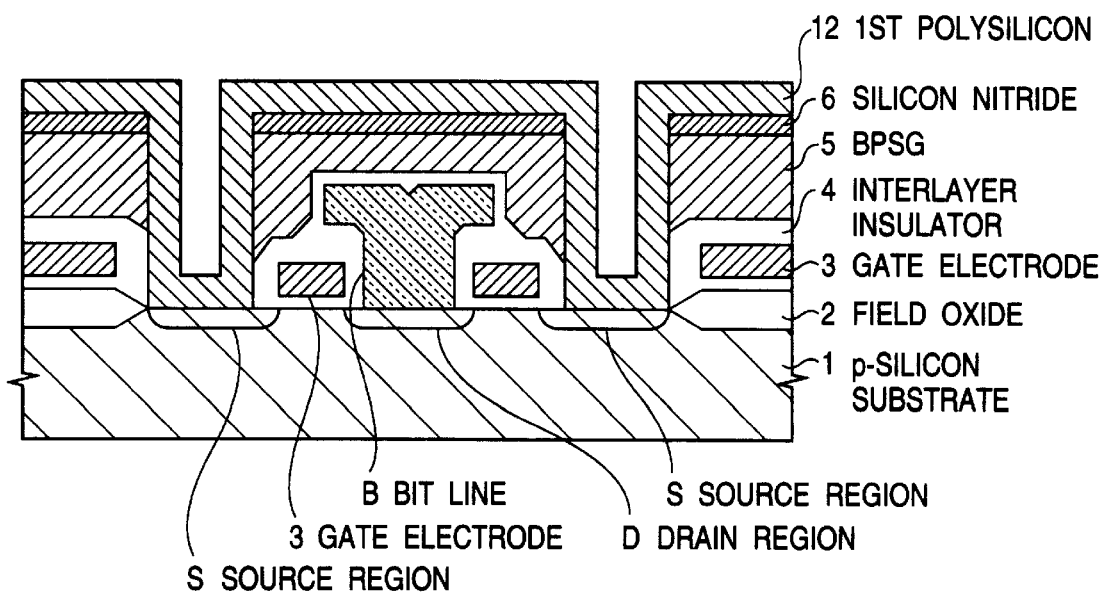
Figure 1C:
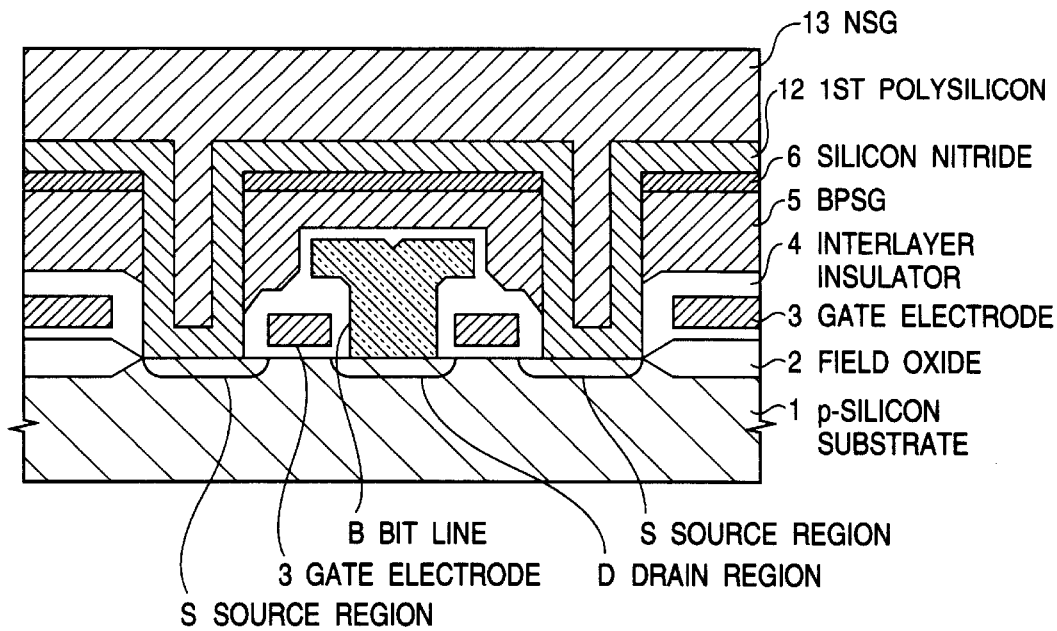
Figure 1D:
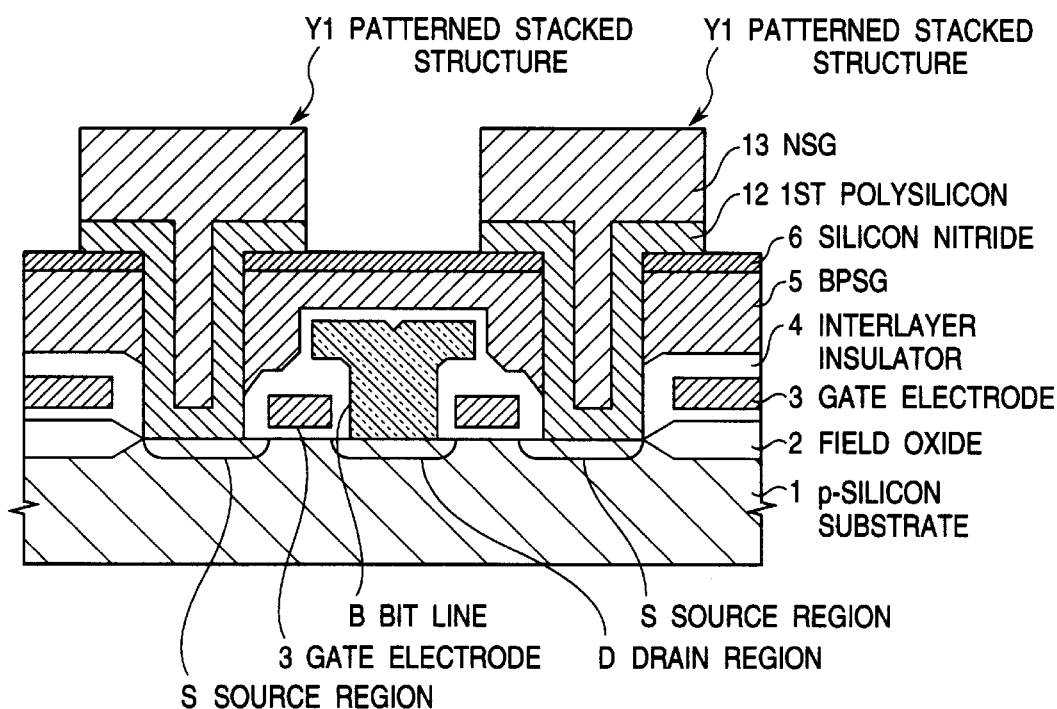
Figure 1E:
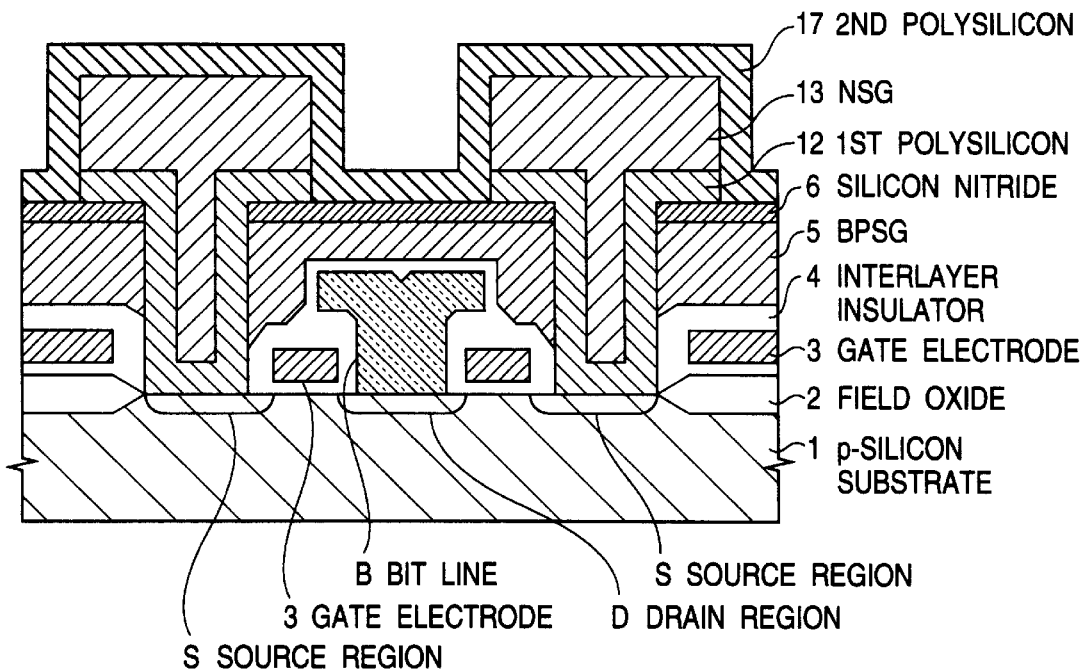
Figure 1F:
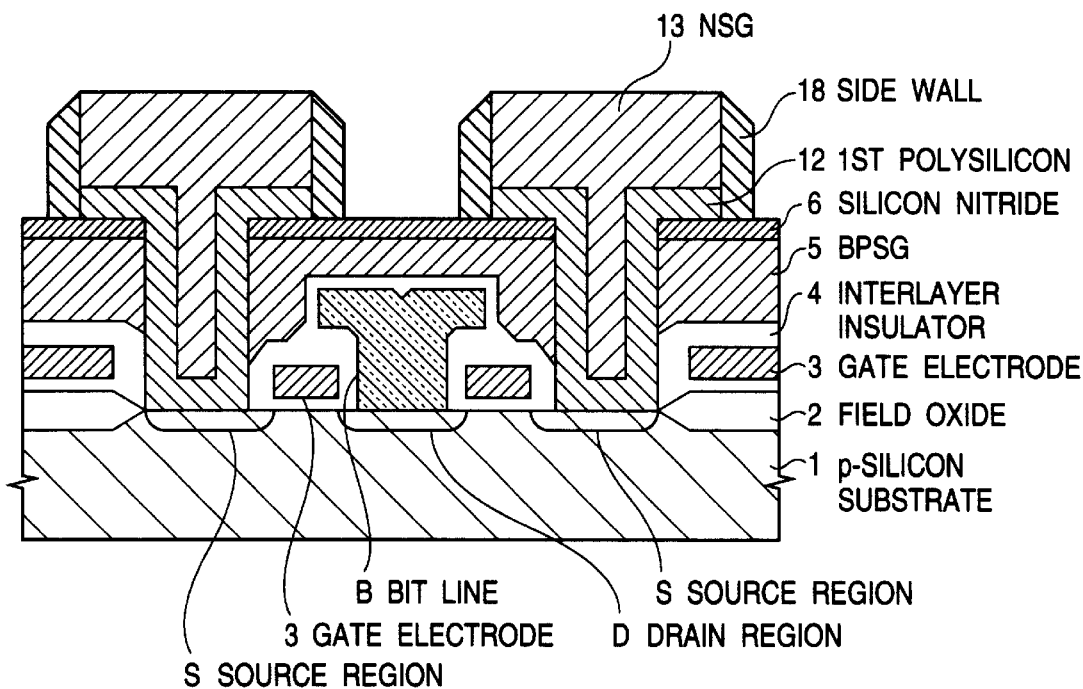
Figure 1G:
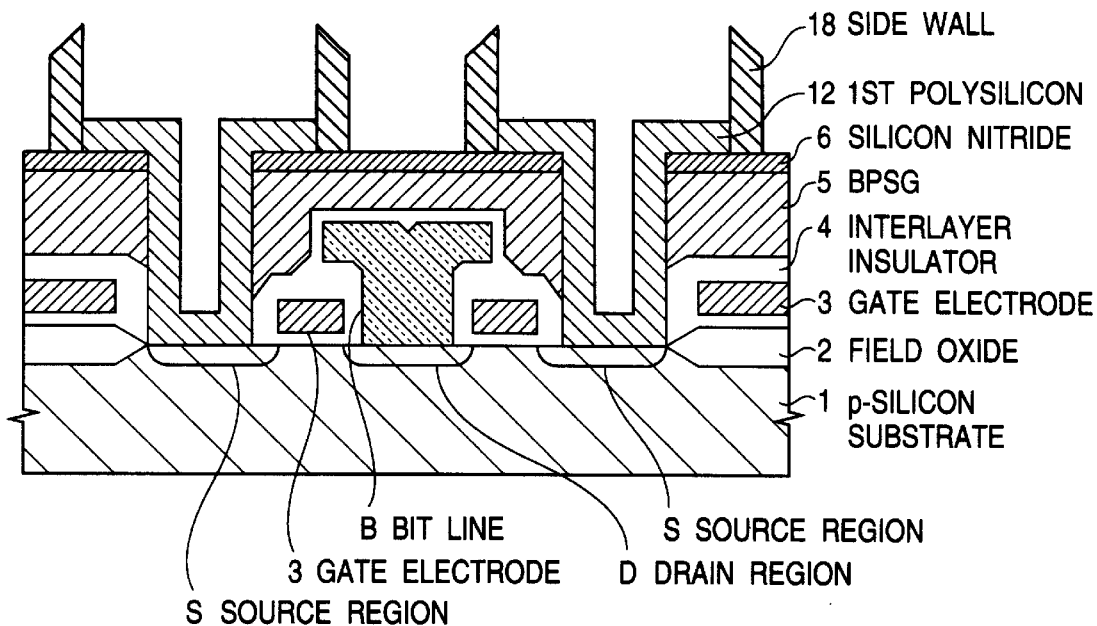
Figure 1H:
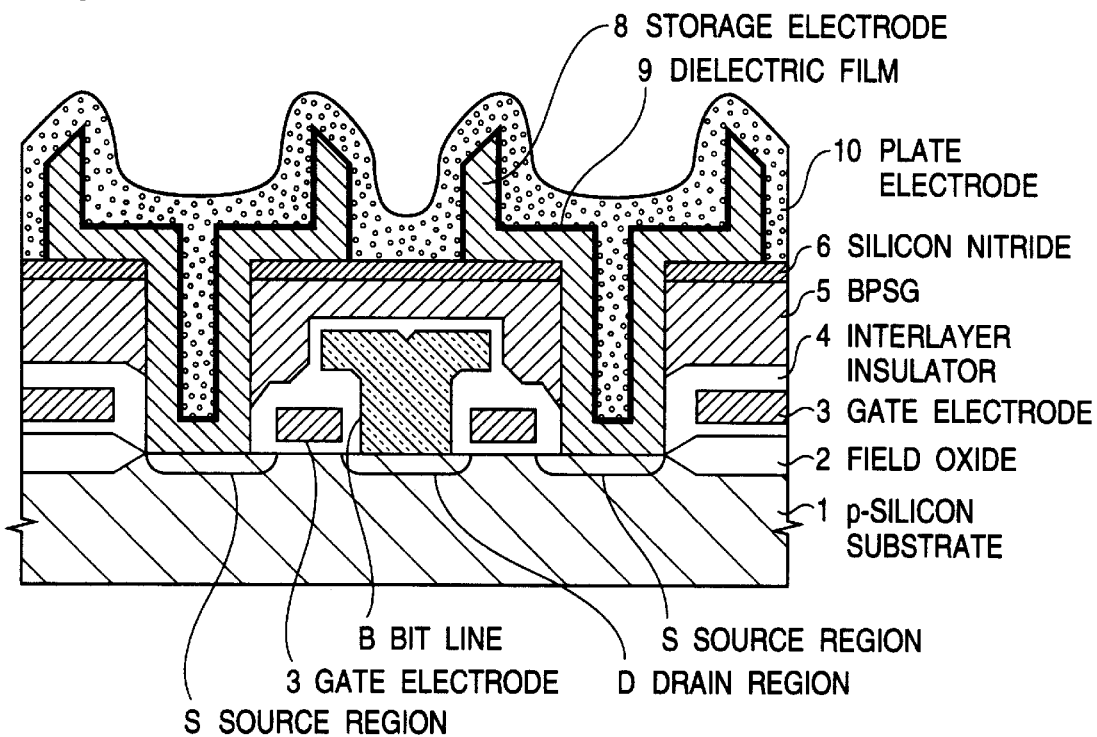
Figure 2:
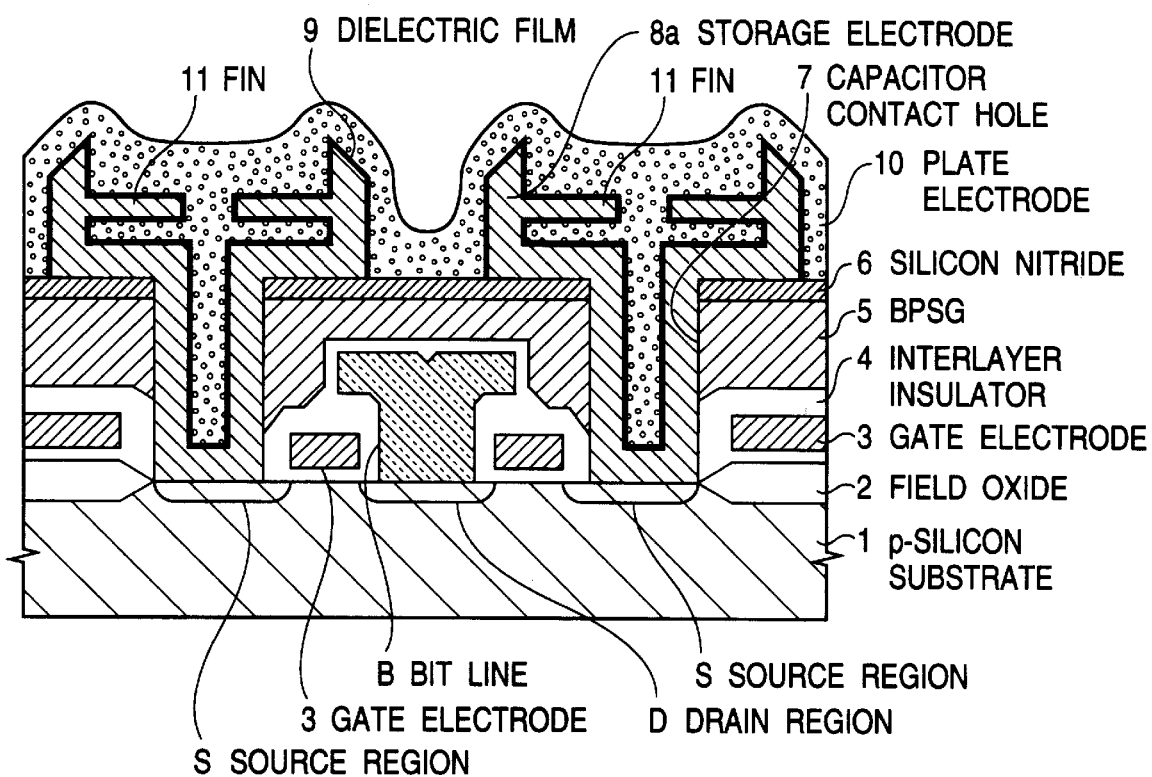
FIG. 2 is a diagrammatic sectional view of a first embodiment of the semiconductor memory in accordance with the present invention.

Referring to FIG. 2, there is shown a diagrammatic sectional view of a first embodiment of the semiconductor memory in accordance with the present invention, which includes a cylindrical stacked capacitor. In FIG. 2, elements similar to those shown in FIGS. 1A to 1H are given the same Reference Numerals.

In FIG. 2, therefore, Reference Numeral 1 designates a p-type silicon substrate, and Reference Numeral 2 indicates a field oxide film. Reference Sign D shows a drain region and Reference Sign S designates a source region. Reference Numeral 3 indicates a gate electrode, and Reference Numeral 4 shows an interlayer insulator film. Reference Numeral 5 designates a BPSG film, and Reference Numeral 6 indicates a silicon nitride film. Reference Numeral 7 shows a capacitor contact hole, and Reference Numeral 8a designates a storage electrode. Reference Numeral 9 indicates a dielectric film and Reference Numeral 10 shows a plate electrode. Reference Numeral 11 designates a fin which constitutes a projection extending from an inner surface of the cylindrical storage electrode at a position higher than an upper surface of the silicon nitride film 6.

Now, the method for manufacturing the first embodiment of the semiconductor memory in accordance with the present invention shown in FIG. 2 will be described with reference to FIGS. 3A to 3H, which are diagrammatic sectional views for illustrating the method for manufacturing the first embodiment of the semiconductor memory.

Figure 3A:
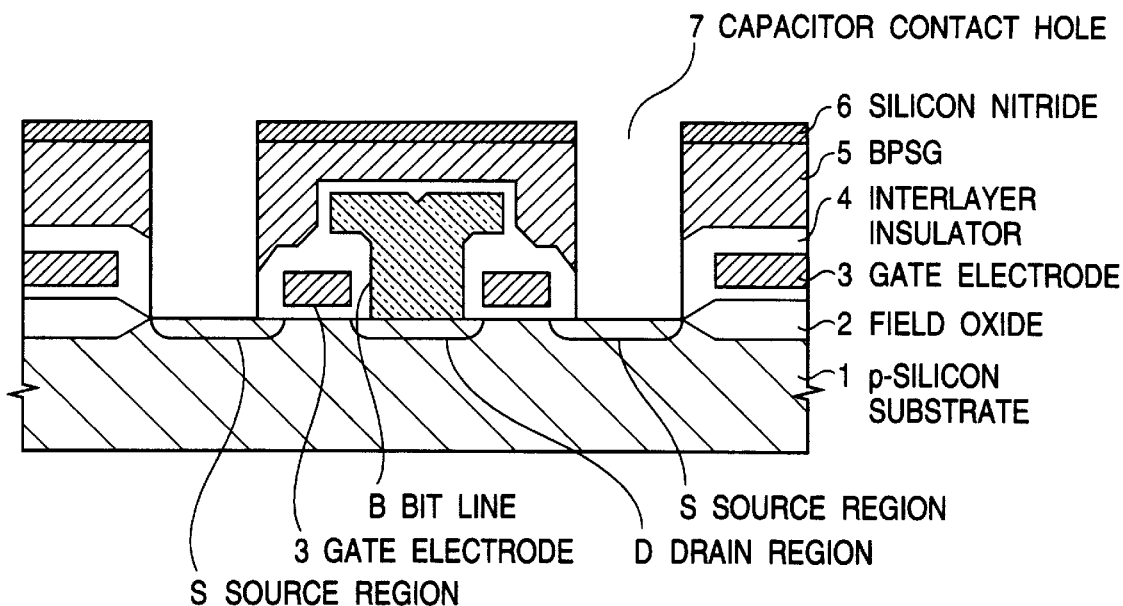
FIGS. 3A to 3H are diagrammatic sectional views for illustrating a method for manufacturing the first embodiment of the semiconductor memory in accordance with the present invention shown in FIG. 2.

As shown in FIG. 3A, a surface of a p-type silicon substrate 1 is divided into an active region and an inactive region by forming a field oxide film 2 on the surface of a p-type silicon substrate 1 by a conventional device isolation process. In the active region, a pair of transistors are formed which have a bit line B and a drain region D formed under the bit line B in contact with the bit line B and in common to the pair of transistors. Each of the transistors has a source region S formed separately form the common drain region D and a gate electrode 3 formed on a gate insulator formed on a region between the common drain D and the individual source region S. The above mentioned elements are formed in a conventional semiconductor device manufacturing process.

Furthermore, in order to isolate the transistors thus formed, from a conducting layer which will be formed at a later step, an interlayer insulator film 4 is formed to cover the whole surface, and a BPSG film 5 is grown on the interlayer insulator film 4 by a low pressure CVD (chemical vapor deposition) or an atmospheric pressure CVD and reflow processing is conducted.

Then, a silicon nitride film (SiN) film 6 is grown on the whole surface, and a capacitor contact hole 7 is formed at a position of a cell node of the memory cell, to penetrate through the silicon nitride film 6, the BPSG film 5 and the interlayer insulator film 4, and to reach the source region S, by means of a photolithography and an anisotropic etching.

Figure 3B:
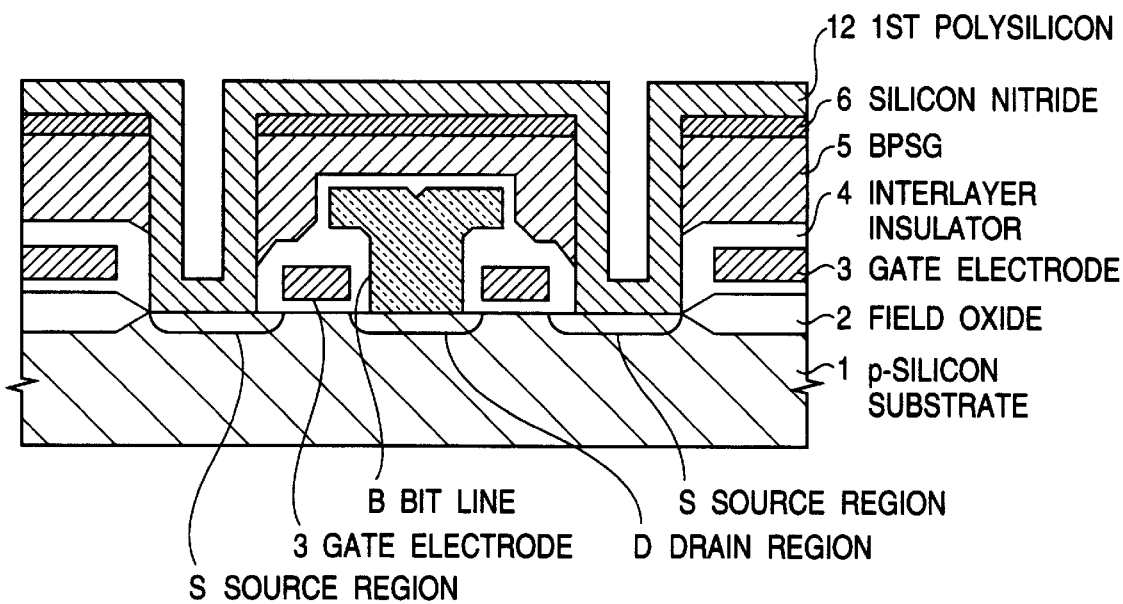

Succeedingly, as shown in FIG. 3B, a first polysilicon film 12 is deposited by low pressure CVD, to cover the whole surface including a surface of the silicon nitride film 6 and an inner surface of the capacitor contact hole 7. The process until this stage is the same as that of the prior art process mentioned hereinbefore.

Figure 3C:
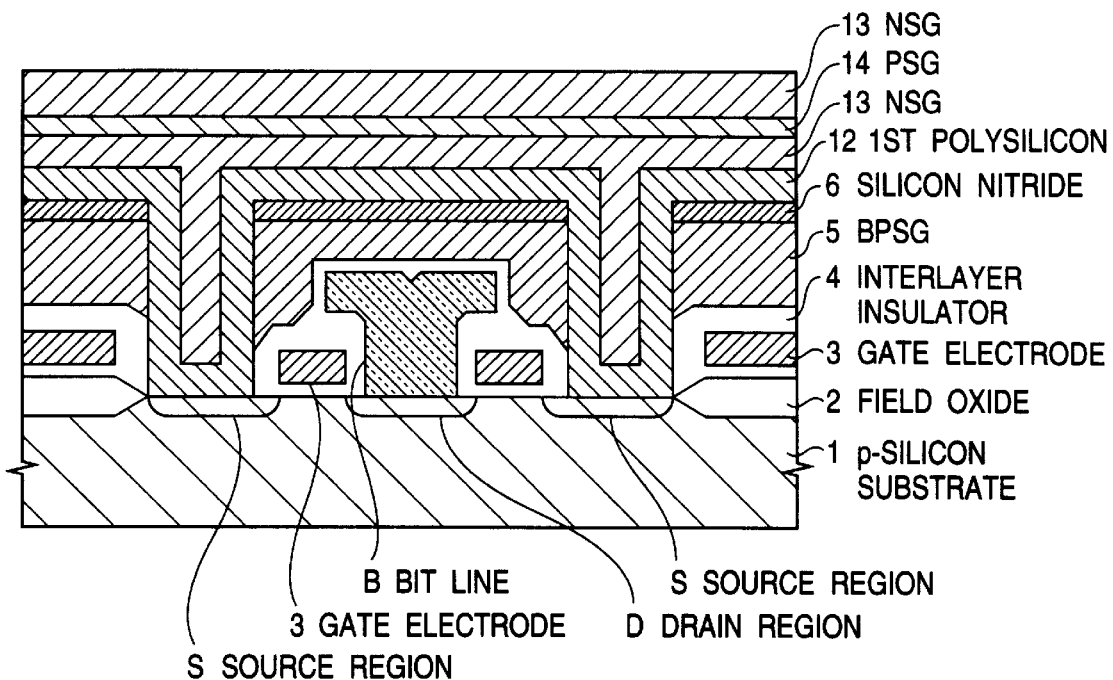

Thereafter, as shown in FIG. 3C, three layers of oxide films are formed in order, as designated by Reference Numerals 13, 14 and 13. Here, the three oxide layers 13, 14 and 13 can be formed of any materials, if there is satisfied the condition that, in a wet isotropic etching, the etching rate of the second oxide layer 14 is higher than that of the first and third oxide layers 13 and 13 so that a sufficient selective ratio can be obtained in the wet isotropic etching. In this embodiment, each of the first and third oxide layers 13 and 13 is formed of an NSG (non-doped silicate glass) film and the second oxide layer 14 is formed of PSG (phosphosilicate glass) film.

Figure 3D:
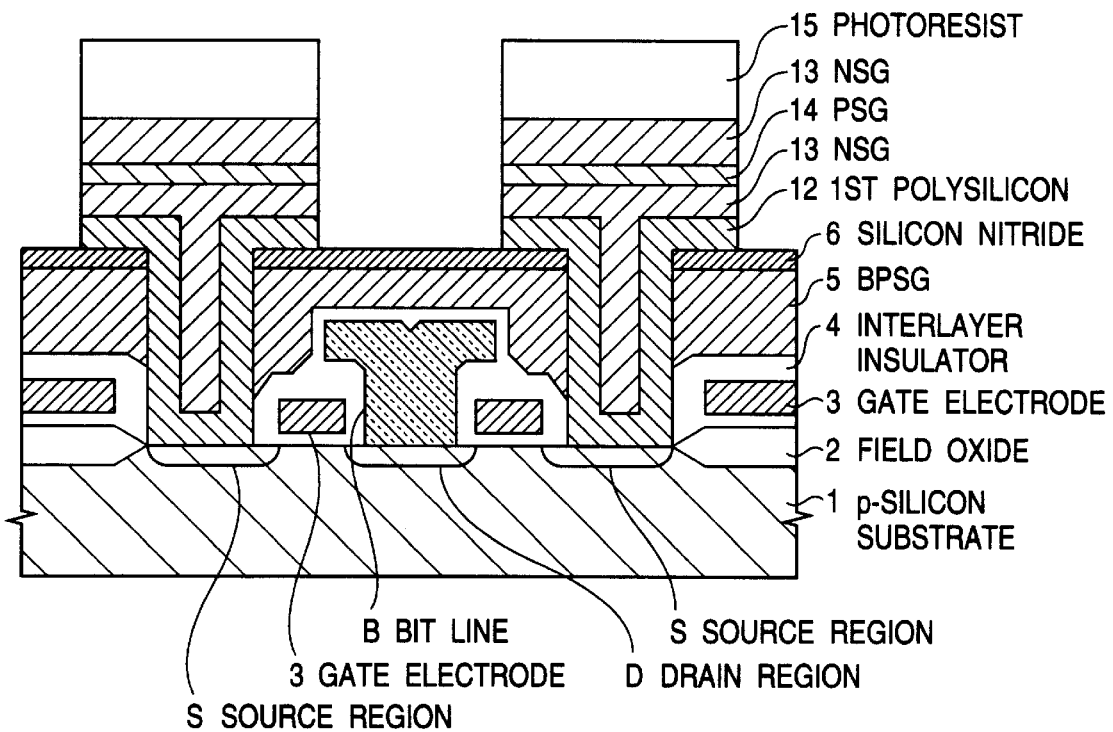

Then, as shown in FIG. 3D, a patterned photo resist layer 15 is formed on the upper NSG film 13, and the stacked structure composed of the first polysilicon film 12 and the three-layer oxide film 13+14+13 are patterned by using the patterned photo resist layer 15 as a mask. After this patterning, the photo resist layer 15 is removed.

Figure 3E:
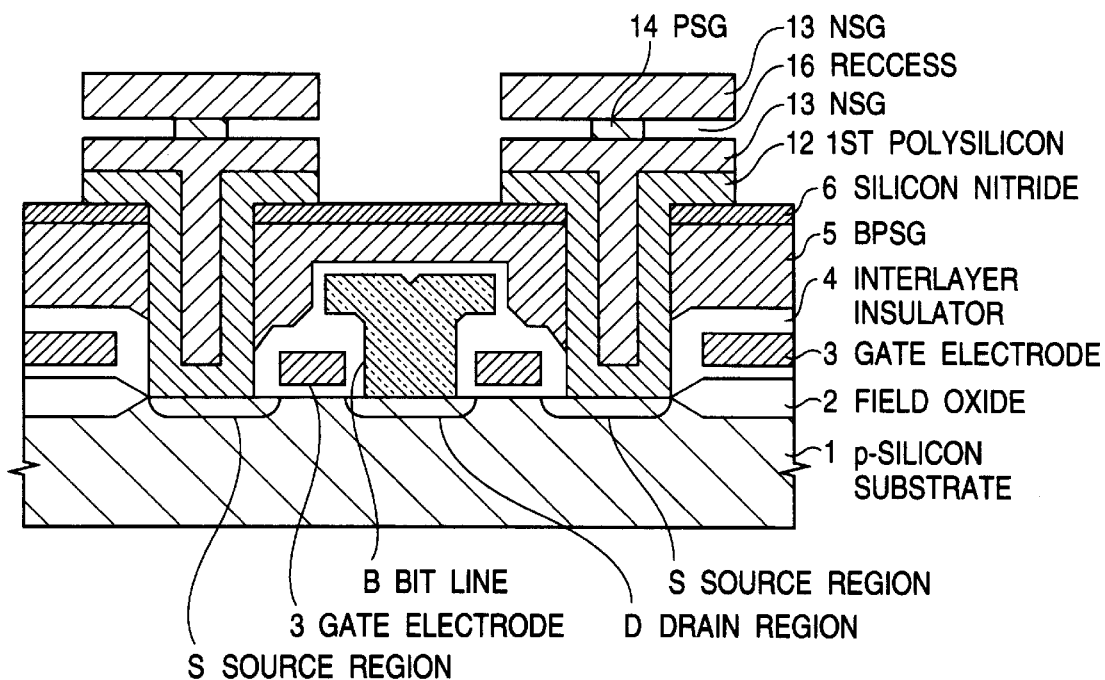

Then, the patterned three-layer oxide film 13+14+13 is isotropically etched by using a DHF (dilute hydrofluoric acid) solution. In this isotropic etching, since the etching rate of the PSG film 14 is as high as ten times the etching rate of the NSG film 13, only the PSG film 14 of the second oxide layer of the three-layer oxide film is selectively etched as shown in FIG. 3E. At this time, it is controlled to ensure that the PSG film 14 is never completely removed, and therefore, a recess 16 is formed between the upper and lower layers 13 of the three-layer oxide film.

Figure 3F:
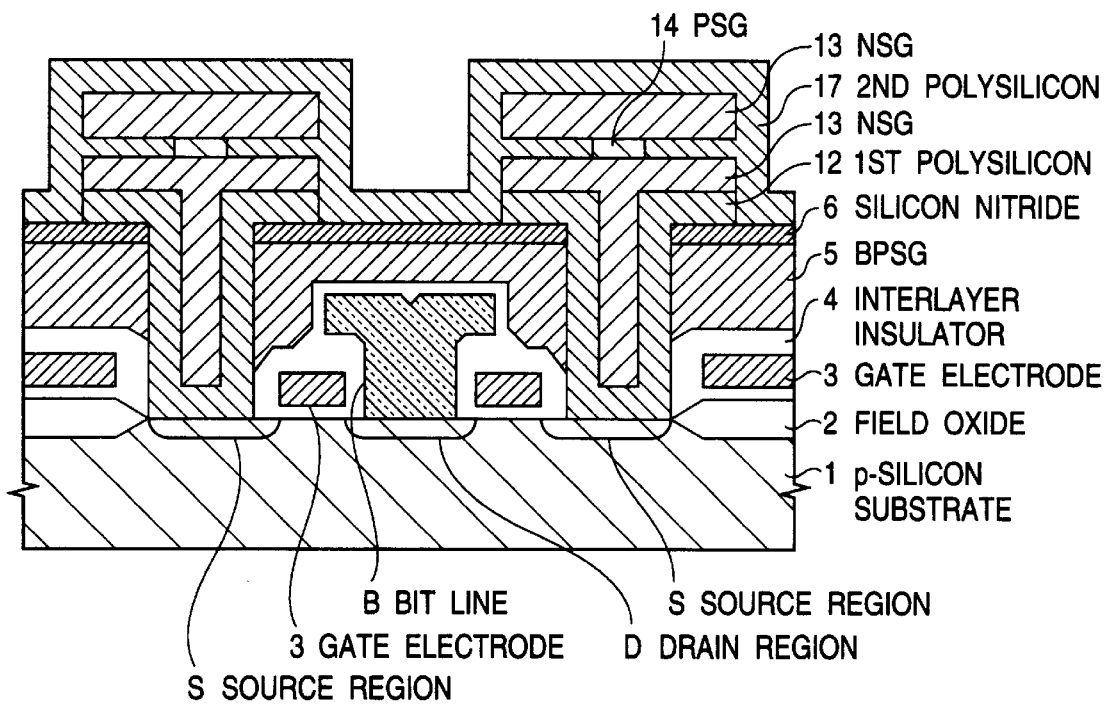
Figure 3G:
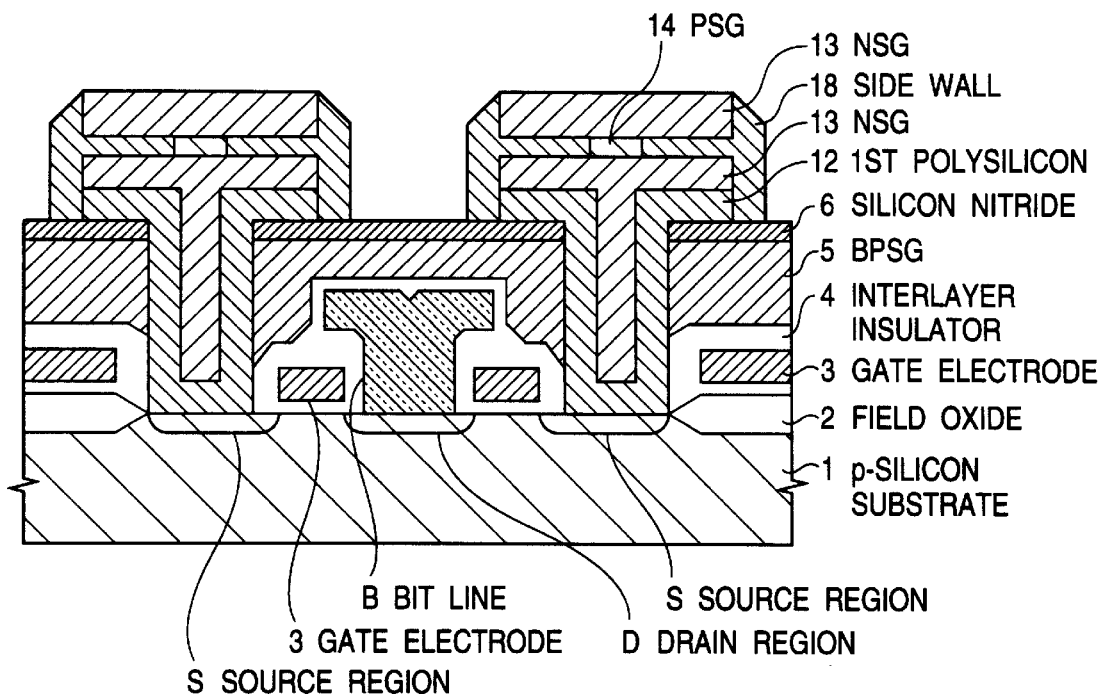

Thereafter, as shown in FIG. 3F, a second polysilicon film 17 is deposited on the whole surface to completely fill the recess 16, and then, as shown in FIG. 3G, an anisotropic etching is conducted to the whole surface so that a side wall 18 of the second polysilicon film 17 is formed on a side surface of the patterned stacked structure of the first polysilicon layer 12 and the three-layer oxide film 13+14+13. Incidentally, since the coverage is 100%, the second polysilicon film 17 can be formed, without using a special process, by a process similar to that used for forming the first polysilicon film 12, for example, by the low pressure CVD.

Figure 3H:
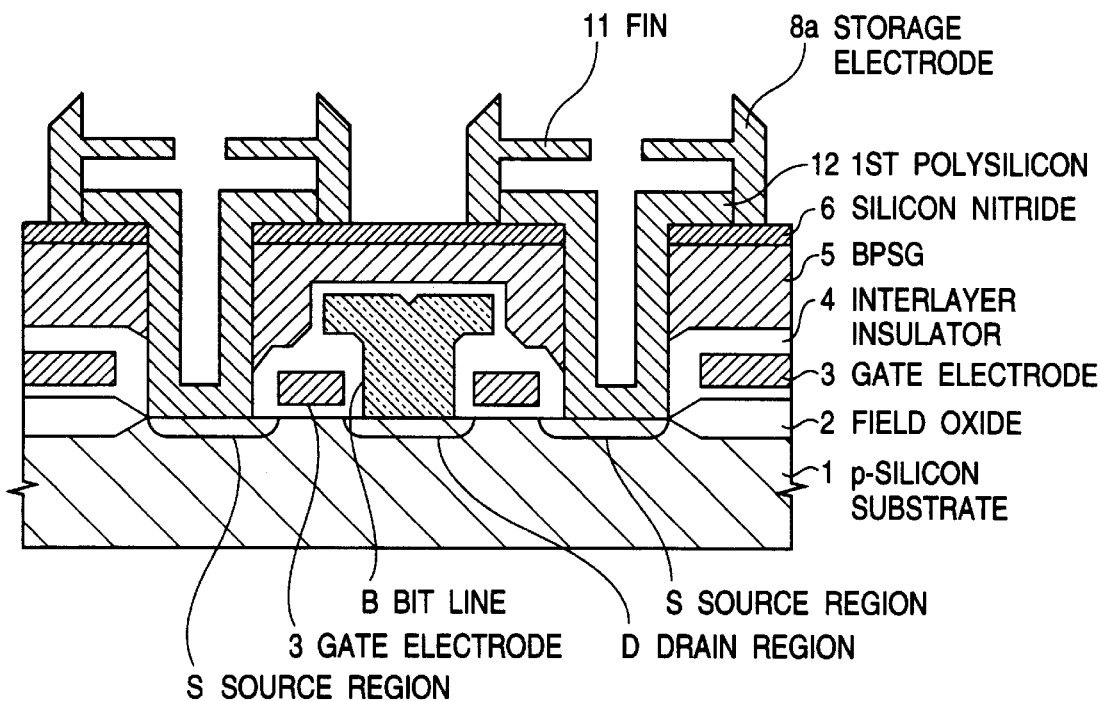

Then, the NSG film 13, the PSG film 14 and the NSG film 13 of the three-layer oxide film are removed in the order from the upper layer by an ammon fluoride (ammonium fluoride) solution, the DHF solution and the ammon fluoride solution. Thus, the storage electrode 8a formed of the first polysilicon film 12 and the second polysilicon film 17 is exposed as shown in FIG. 3H. The storage electrode 8a thus formed has the fin 11 which is formed by the second polysilicon film 17 entering into the recess 16 and which is integral with the storage electrode 8a. This fin 11 projects horizontally from an inner surface of the cylindrical portion horizontally toward a center axis of the cylindrical portion. Namely, the fin 11 is in the form of a ring extending along the inner circumference of the cylindrical portion one turn.

Thereafter, as shown in FIG. 2, a dielectric material film 9 is formed on the whole exposed surface of the storage electrode 8a by the low pressure CVD, and then, a third polysilicon film is deposited on the whole surface and patterned to form the plate electrode 10 of the stacked capacitor. Thus, the capacitor structure of the DRAM is completed.

Incidentally, the dielectric film 9 is formed of for example a silicon nitride (SiN) having an oxidized surface. The third polysilicon film deposited to form the plate electrode 10 can be formed by the low pressure CVD, similarly to the second polysilicon film 17.

The first embodiment of the semiconductor memory in accordance with the present invention has the following advantages, since it is manufactured by the above mentioned process.

Since the fin 11 is formed on the inside of the cylindrical storage electrode 8a, an effective surface area is increased as compared with the prior art cylindrical storage electrode having no fin. Namely, the effective surface area is larger than that of the prior art cylindrical storage electrode having no fin, by the amount corresponding to the surface area of the fin 11, so that the storage capacitance can be correspondingly increased. Furthermore, since the annular fin 11 is formed on the inside of the cylindrical storage electrode 8*a*, the strength of the side wall 18 can be elevated.

It is considered that after the side wall 18 is formed, the fin 11 is formed separately. However, in the process in accordance with the present invention for manufacturing the semiconductor memory, since the fin is formed integrally with the side wall 18 at the same time as the side wall 18 is formed, no natural oxide film exists at a boundary between the side wall 18 and the fin 11, and therefore, a capacitor having a high reliability can be obtained.

Second Embodiment

Figure 4:
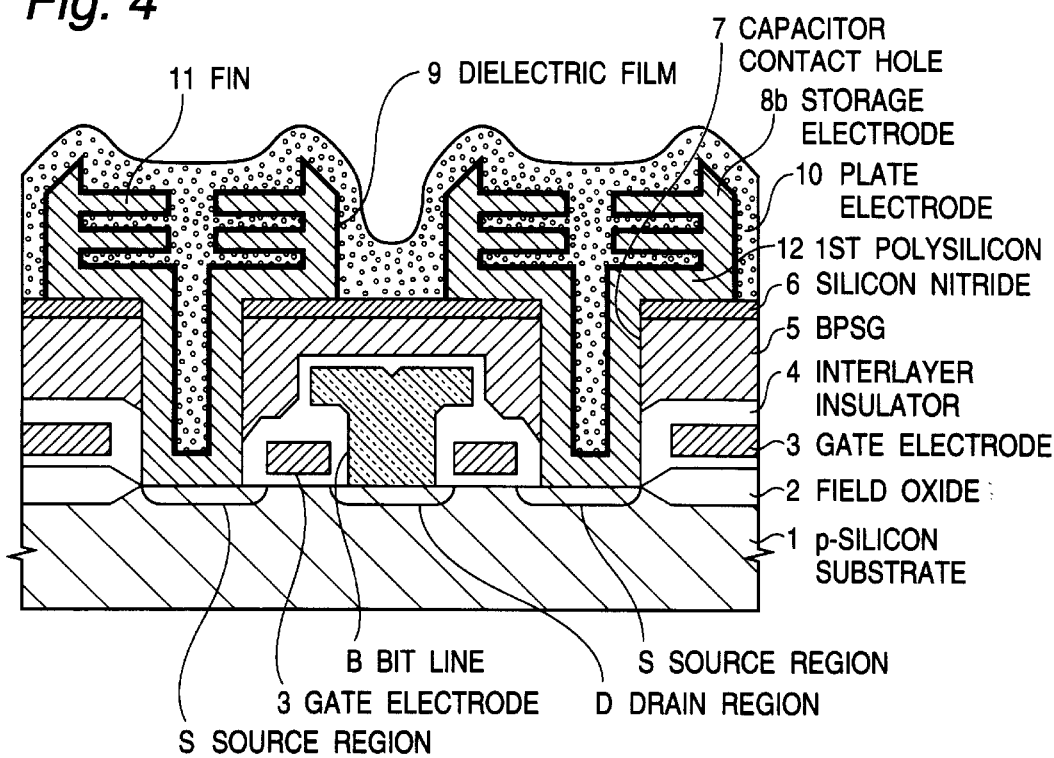
FIG. 4 is a diagrammatic sectional view of a second embodiment of the semiconductor memory in accordance with the present invention.

Referring to FIG. 4, there is shown a diagrammatic sectional view of a second embodiment of the semiconductor memory in accordance with the present invention, which includes a cylindrical stacked capacitor. In FIG. 4, elements similar to those shown in FIGS. 1A to 1H and FIGS. 2 and 3A to 3H are given the same Reference Numerals.

In FIG. 4, therefore, Reference Numeral 1 designates a p-type silicon substrate, and Reference Numeral 2 indicates a field oxide film. Reference Sign D shows a drain region and Reference Sign S designates a source region. Reference Numeral 3 indicates a gate electrode, and Reference Numeral 4 shows an interlayer insulator film. Reference Numeral 5 designates a BPSG film, and Reference Numeral 6 indicates a silicon nitride film. Reference Numeral 7 shows a capacitor contact hole, and Reference Numeral 8*b* designates a storage electrode. Reference Numeral 9 indicates a dielectric film and Reference Numeral 10 shows a plate electrode. Reference Numeral 11 designates a fin. In this embodiment, two fins 11 are provided on the inside of the cylindrical storage electrode.

Now, the method for manufacturing the second embodiment of the semiconductor memory in accordance with the present invention shown in FIG. 4 will be described with reference to FIGS. 5A to 5G, which are diagrammatic sectional views for illustrating the method for manufacturing the second embodiment of the semiconductor memory.

Figure 5A:
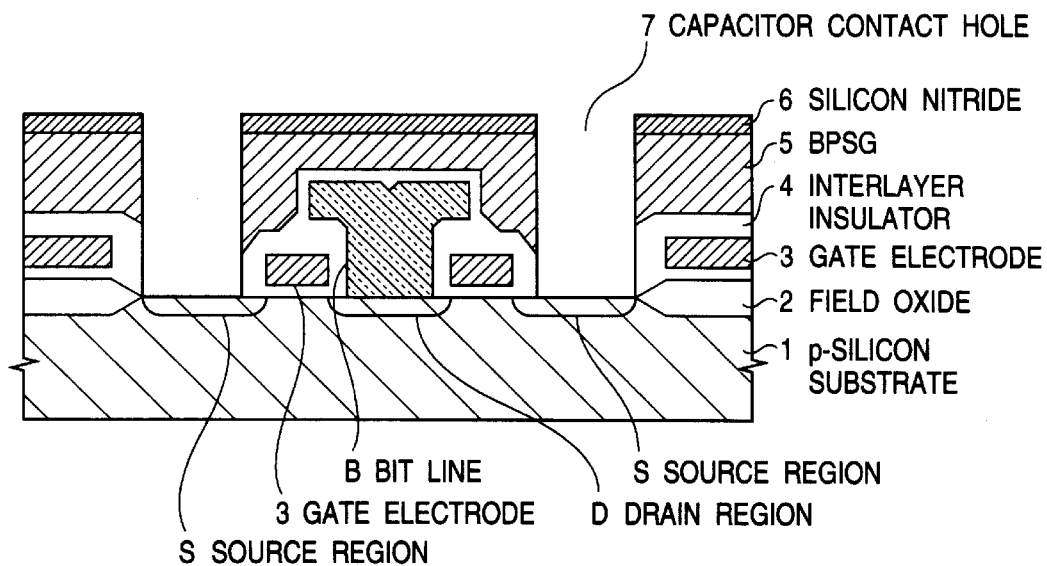
FIGS. 5A to 5G are diagrammatic sectional views for illustrating a method for manufacturing the second embodiment of the semiconductor memory in accordance with the present invention shown in FIG. 4.
Figure 5B:
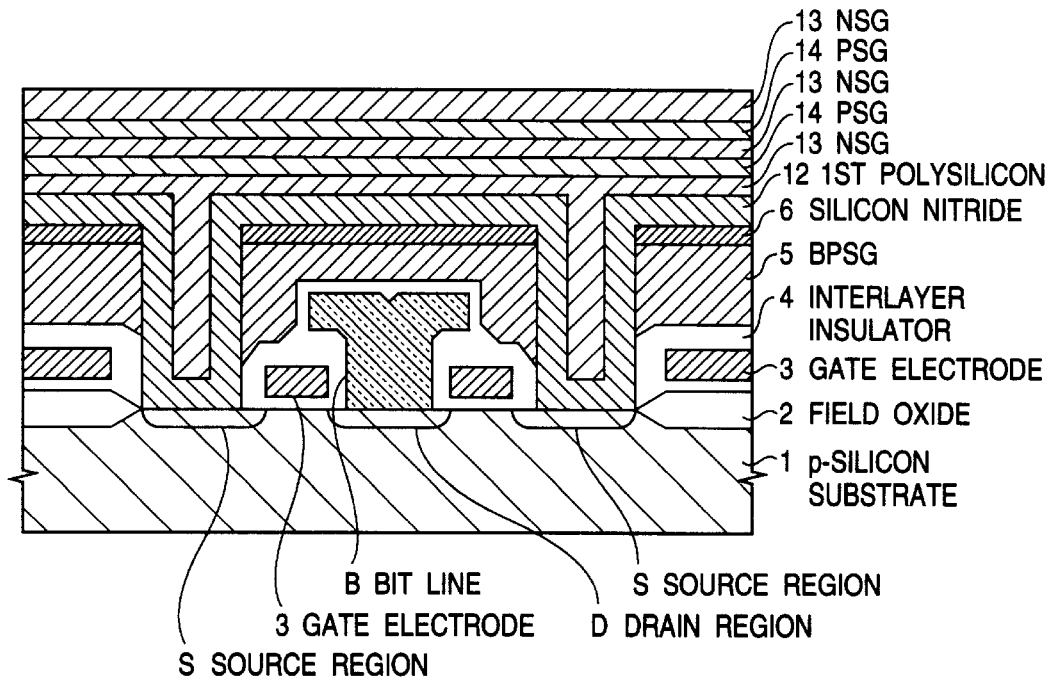

The process until the process of forming the capacitor contact hole 7 as shown in FIG. 5A and further depositing the first polysilicon film 12 as shown in FIG. 5B, is the same as the corresponding process of the first embodiment.

Figure 5C:
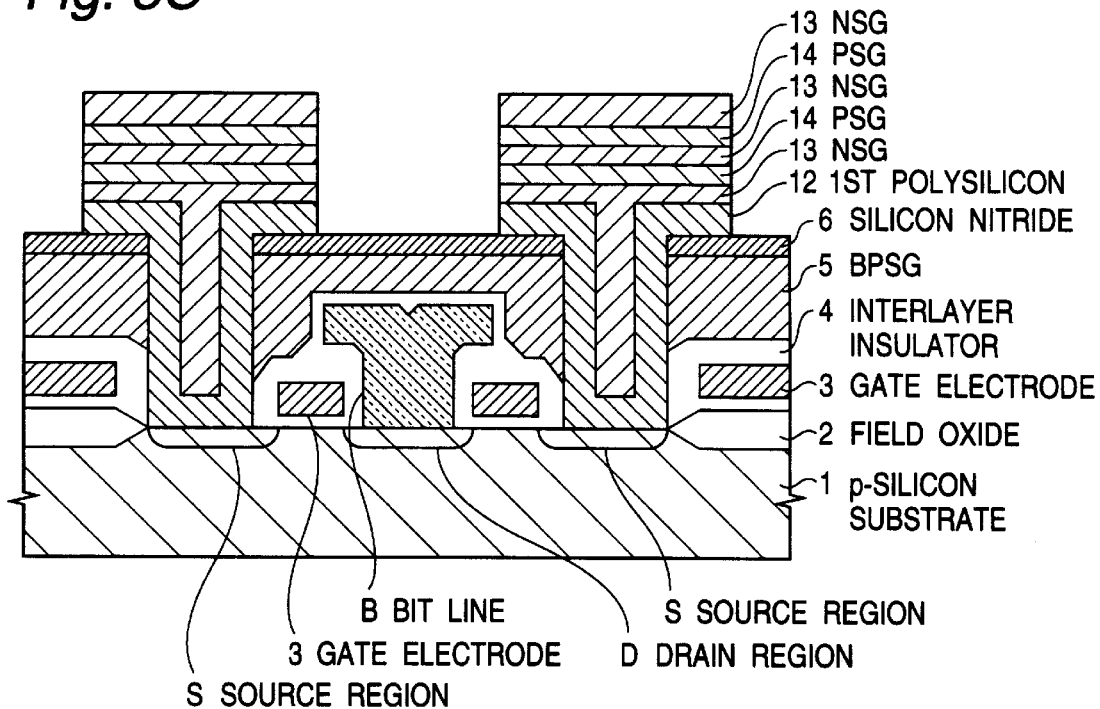

Thereafter, five layers of oxide films are formed in order, as designated by Reference Numerals 13, 14, 13, 14 and 13 in FIG. 5B. Here, the five oxide layers can be formed of any materials, if there is satisfied the condition that, in a wet isotropic etching, the etching rate of the second and fourth oxide layers 14 and 14 is higher than that of the first, third and fifth oxide layers 13, 13 and 13 so that a sufficient selective ratio can be obtained in the wet isotropic etching. In this embodiment, each of the first, third and fifth oxide layers 13, 13 and 13 is formed of an NSG (non-doped silicate glass) film and each of the second and fourth oxide layers 14 and 14 is formed of PSG (phosphosilicate glass) film Then, the stacked structure composed of the first polysilicon film 12 and the five-layer oxide film 13+14+13+14+13 are patterned as shown in FIG. 5C, into a shape corresponding to a cylindrical storage electrode of the stacked capacitor.

Figure 5D:
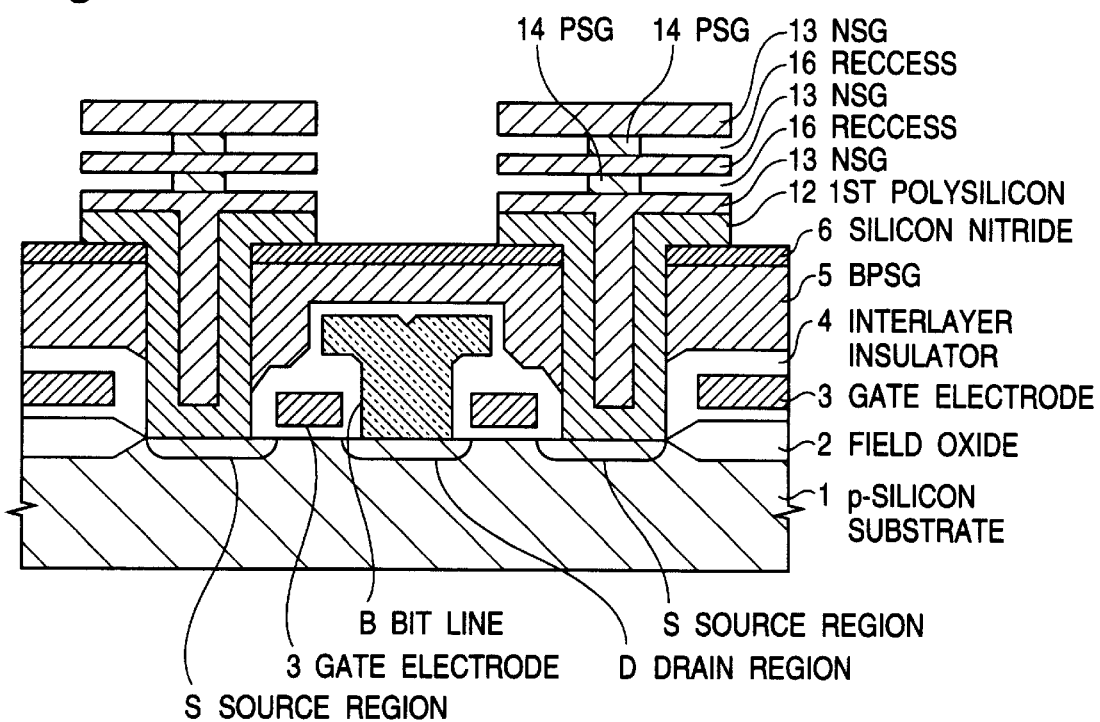

Then, the patterned five-layer oxide film 13+14+13+14+13 is isotropically etched by using a DHF (dilute hydrofluoric acid) solution. In this isotropic etching, similarly to the first embodiment, only the PSG films 14 of the second and fourth oxide layers of the five-layer oxide film are selectively etched as shown in FIG. 5D. At this time, it is controlled to ensure that the PSG films 14 are never completely removed, and therefore, a recess 16 is formed at a position of the second and fourth oxide layers of the five-layer oxide film 13+14+13+14+13.

Figure 5E:
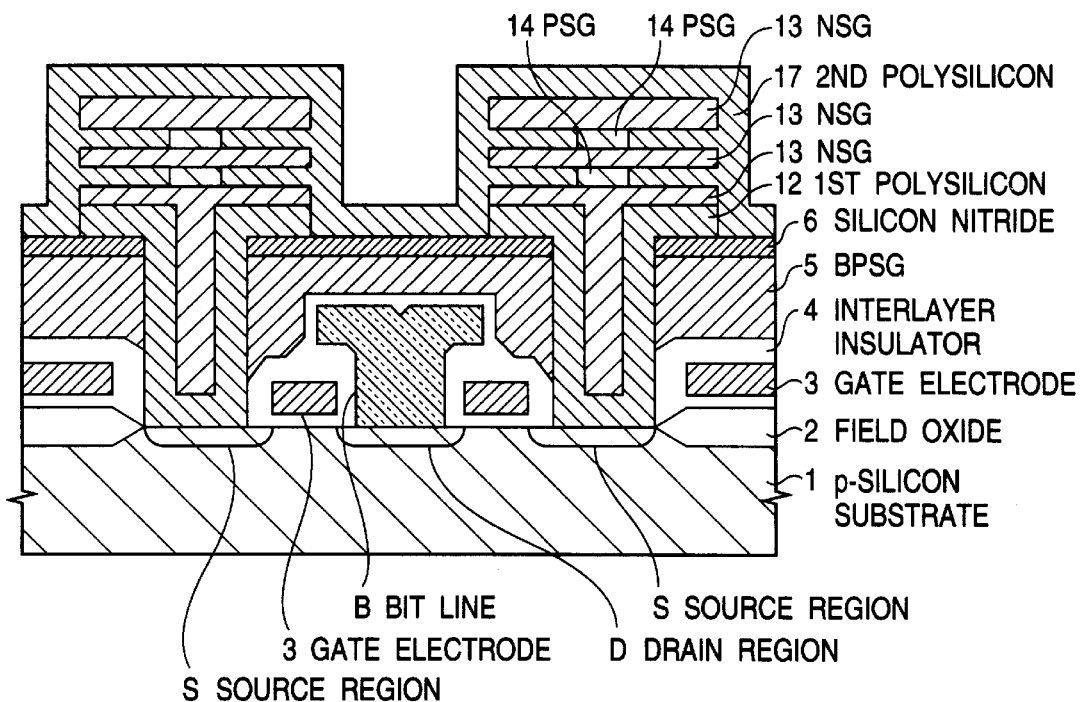
Figure 5F:
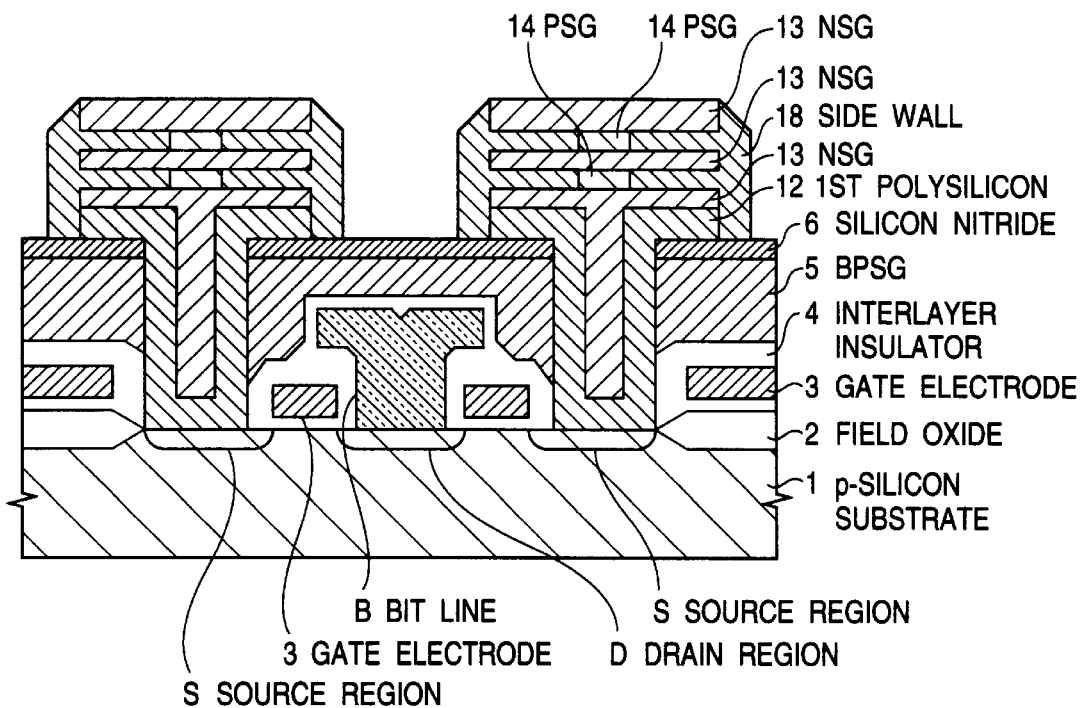

Thereafter, as shown in FIG. 5E, a second polysilicon film 17 is deposited on the whole surface by the low pressure CVD, to completely fill the recesses 16, and then, as shown in FIG. 5F, an anisotropic etching is conducted to the whole surface so that a side wall 18 of the second polysilicon film 17 is formed on a side surface of the patterned stacked structure of the first polysilicon layer 12 and the five-layer oxide film 13+14+13+14+13.

Figure 5G:
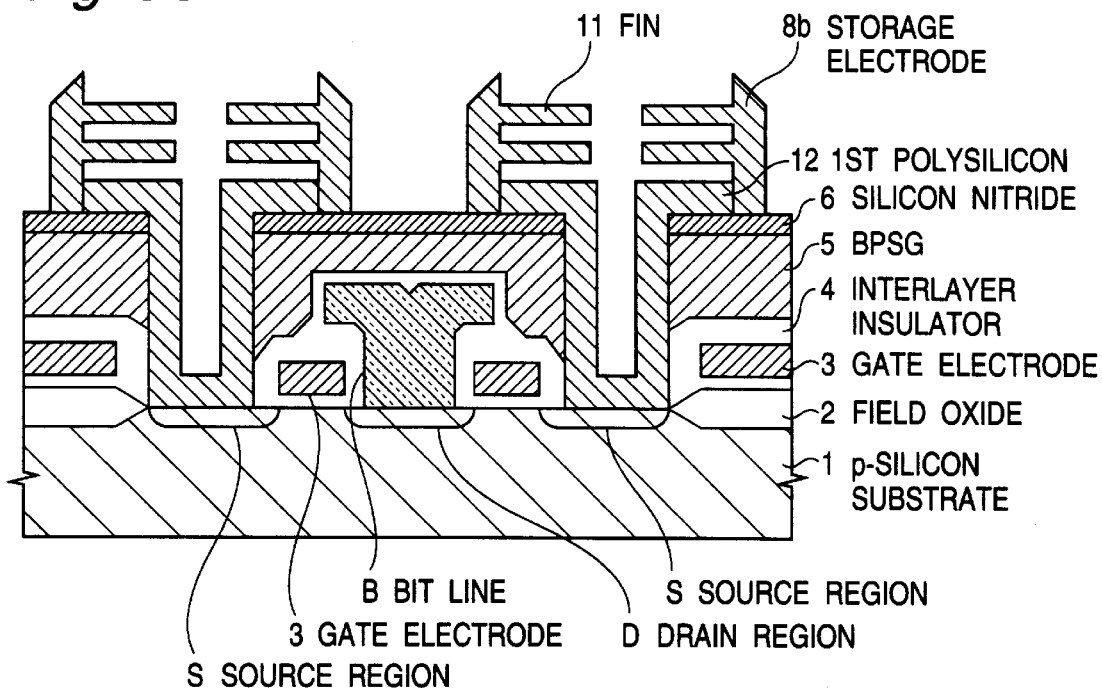

Then, the five-layer oxide film 13+14+13+14+13 is removed by an ammon fluoride (ammonium fluoride) solution and the DHF solution, so that the storage electrode 8*b* formed of the first polysilicon film 12 and the second polysilicon film 17 is exposed as shown in FIG. 5G. The storage electrode 8*b* thus formed has the two fins 11 which are formed in parallel to each other, by the second polysilicon film 17 entering into the recesses 16 separated from each other at a predetermined distance in a vertical direction, and which are integral with the storage electrode 8*b*. These fins 11 project horizontally from an inner surface of the cylindrical portion toward a center axis of the cylindrical portion. Namely, each of the fins 11 is in the form of a ring extending along the inner circumference of the cylindrical portion one turn.

Thereafter, as shown in FIG. 4, a dielectric material film 9 is formed on the whole surface by the low pressure CVD, and then, a third polysilicon film is deposited on the whole surface and patterned to form the plate electrode 10 of the stacked capacitor. Thus, the capacitor structure of the DRAM is completed.

The second embodiment of the semiconductor memory in accordance with the present invention has the following advantages, since it is manufactured by the above mentioned process.

Since the two fins 11 are formed on the inside of the cylindrical storage electrode 8*b*, an effective surface area is increased as compared with the first embodiment by the amount corresponding to the surface area of one fin 11, so that the storage capacitance can be correspondingly increased. Furthermore, since the two fins 11 are formed on the inside of the cylindrical storage electrode 8*a*, the strength of the cylindrical side wall 18 can be further elevated as compared with the first embodiment.

Furthermore, since the fins are formed integrally with the side wall 18 at the same time as the side wall 18 is formed, similarly to the first embodiment, no natural oxide film exists at a boundary between the side wall 18 and each fin 11, and therefore, a capacitor having a high reliability can be obtained.

Third Embodiment

Figure 6:
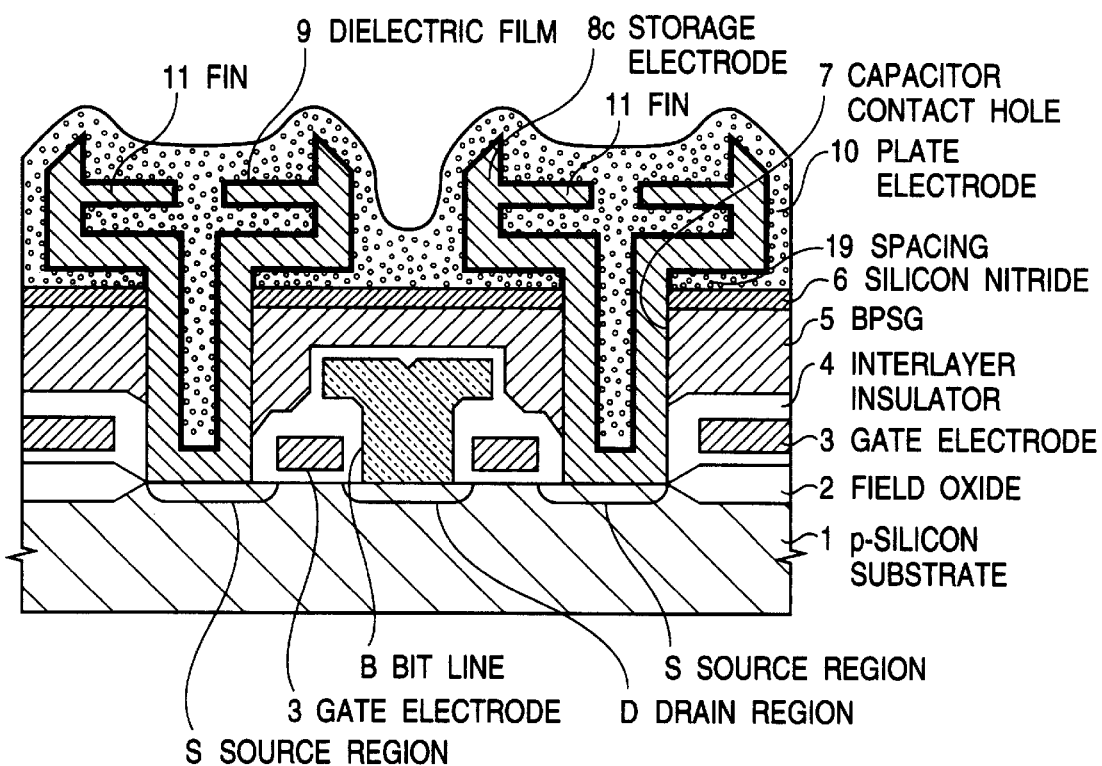
FIG. 6 is a diagrammatic sectional view of a third embodiment of the semiconductor memory in accordance with the present invention.

Referring to FIG. 6, there is shown a diagrammatic sectional view of a third embodiment of the semiconductor memory in accordance with the present invention, which includes a cylindrical stacked capacitor. In FIG. 6, elements similar to those shown in FIGS. 1A to 1H and FIGS. 2, 3A to 3G, 4 and 5A to 5G are given the same Reference Numerals .

In FIG. 6, therefore, Reference Numeral 1 designates a p-type silicon substrate, and Reference Numeral 2 indicates a field oxide film. Reference Sign D shows a drain region and Reference Sign S designates a source region. Reference Numeral 3 indicates a gate electrode, and Reference Numeral 4 shows an interlayer insulator film. Reference Numeral 5 designates a BPSG film, and Reference Numeral 6 indicates a silicon nitride film. Reference Numeral 7 shows a capacitor contact hole, and Reference Numeral 8c designates a storage electrode. Reference Numeral 9 indicates a dielectric film and Reference Numeral 10 shows a plate electrode. Reference Numeral 11 designates a fin which constitutes a projection extending from an inner surface of a cylindrical storage electrode at a position higher than an upper surface of the silicon nitride film 6, and Reference Numeral 19 is a spacing between the upper surface of the silicon nitride film 6 and a lower surface of a cylindrical storage portion positioned above the upper surface of the silicon nitride film 6 and having an outer size larger than the inner size of the capacitor contact hole 7.

Now, the method for manufacturing the third embodiment of the semiconductor memory in accordance with the present invention shown in FIG. 6 will be described with reference to FIGS. 7A to 7G, which are diagrammatic sectional views for illustrating the method for manufacturing the third embodiment of the semiconductor memory.

The process until the process of depositing the BPSG film 5 and conducting the reflowing and further depositing the silicon nitride film 6 on the whole surface is the same as the corresponding process of the first embodiment.

Then, an NSG film 13 is formed on the whole surface, and thereafter, a capacitor contact hole 7 is formed at a position of a cell node of the memory cell, to penetrate through the NSG film 13, the silicon nitride film 6, the BPSG film 5 and the interlayer insulator film 4, and to reach the source region S, by means of a photolithography and an anisotropic etching.

Figure 7A:
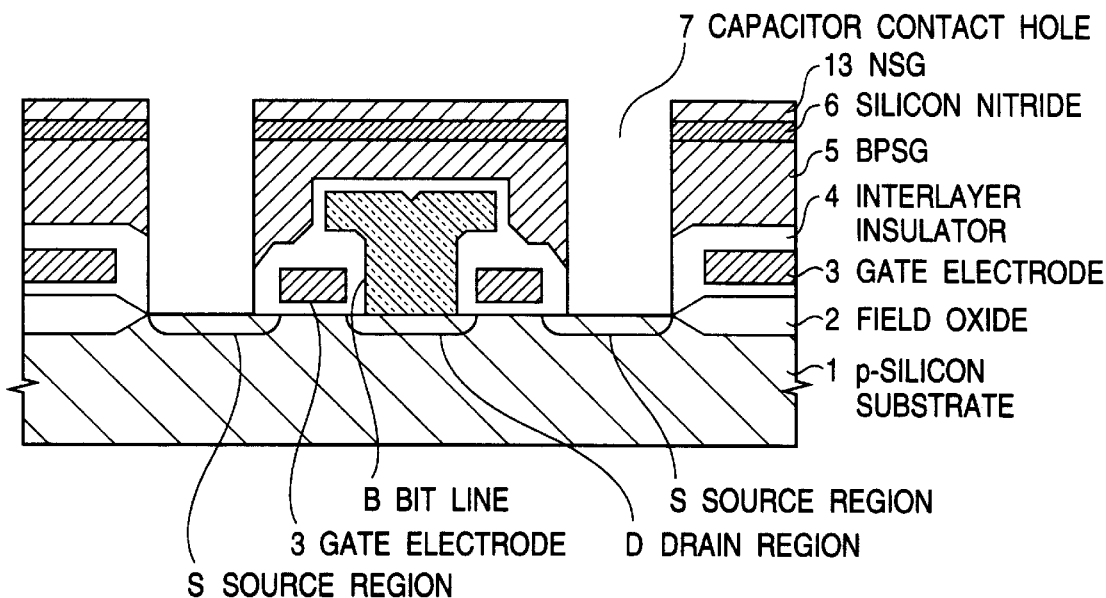
FIGS. 7A to 7G are diagrammatic sectional views for illustrating a method for manufacturing the third embodiment of the semiconductor memory in accordance with the present invention shown in FIG. 6.
Figure 7B:
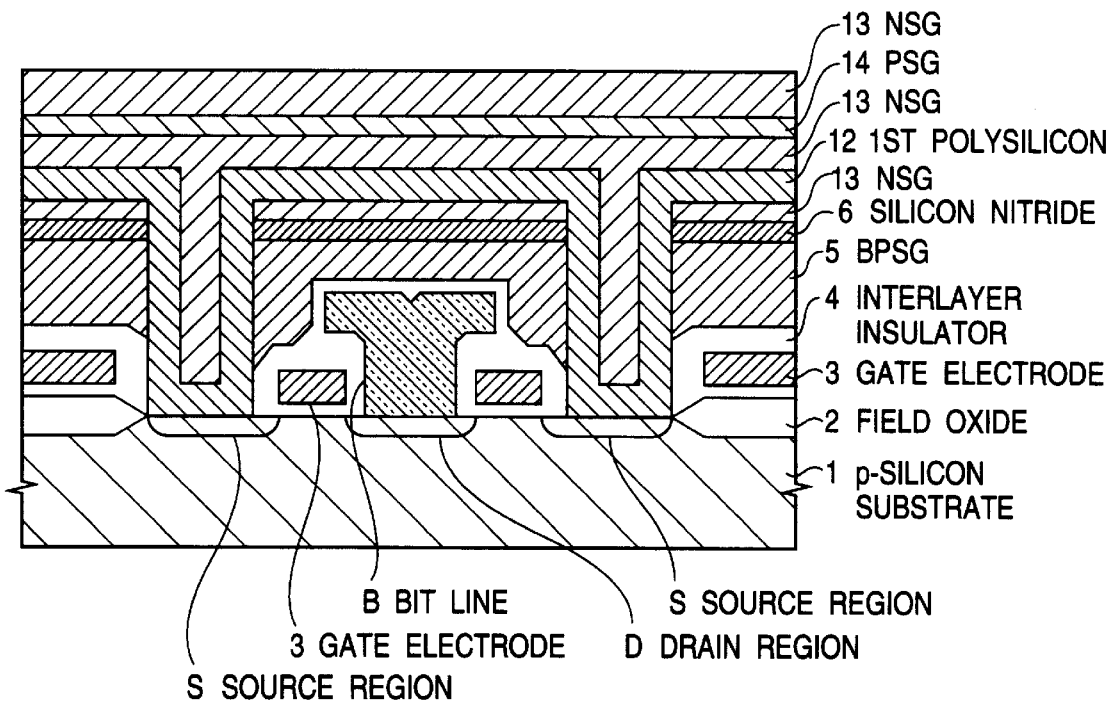

Succeedingly, as shown in FIG. 7B, a first polysilicon film 12 is deposited by the lower pressure CVD, to cover the whole surface including a surface of the NSG film 13 and an inner surface of the capacitor contact hole 7. Furthermore, there layers 13, 14 and 13 of oxide films are formed in order, similarly to the first embodiment.

Figure 7C:
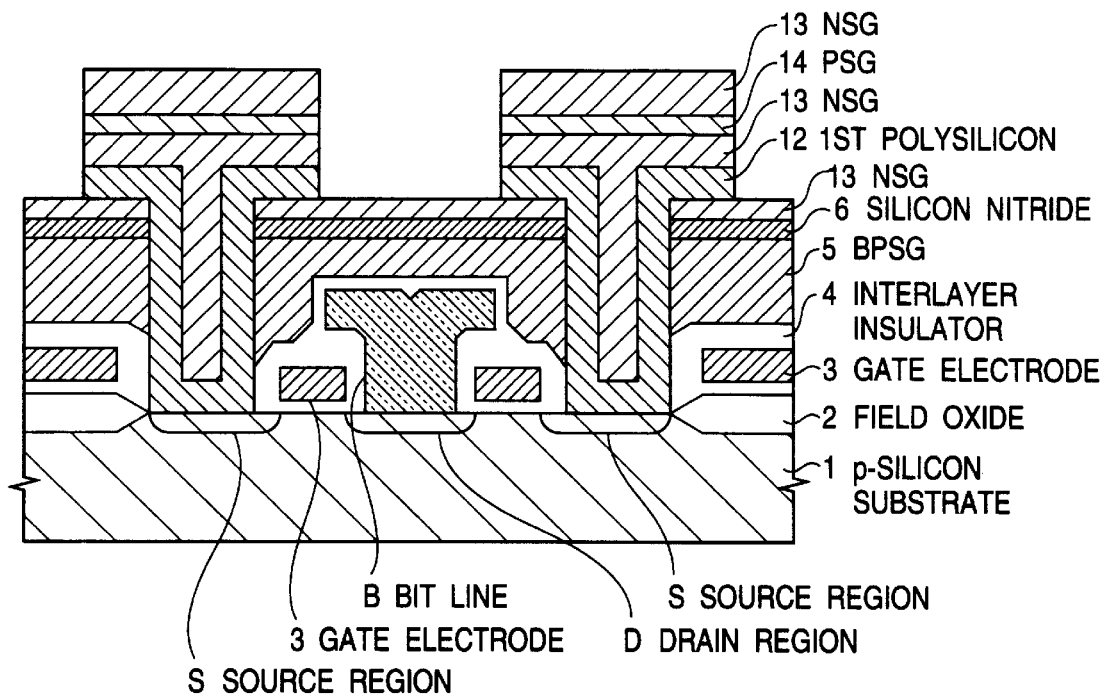

As shown in FIG. 7C, the stacked structure composed of the first polysilicon film 12 and the three-layer oxide film 13+14+13 are patterned into the shape corresponding to a storage electrode of the stacked capacitor.

Figure 7D:
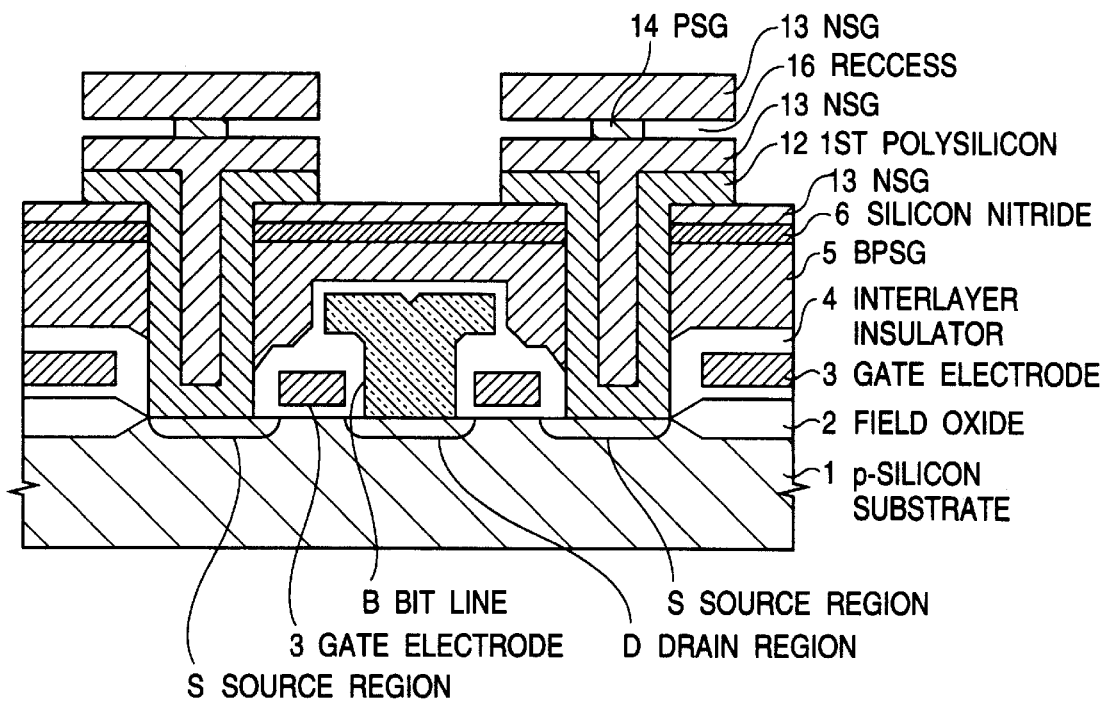

Then, similarly to the first embodiment, the patterned three-layer oxide film 13+14+13 is isotropically etched by using a DHF (dilute hydrofluoric acid) solution, so that, as shown in FIG. 7D, a recess 16 is formed between the upper and lower layers 13 of the three-layer oxide film.

Figure 7E:
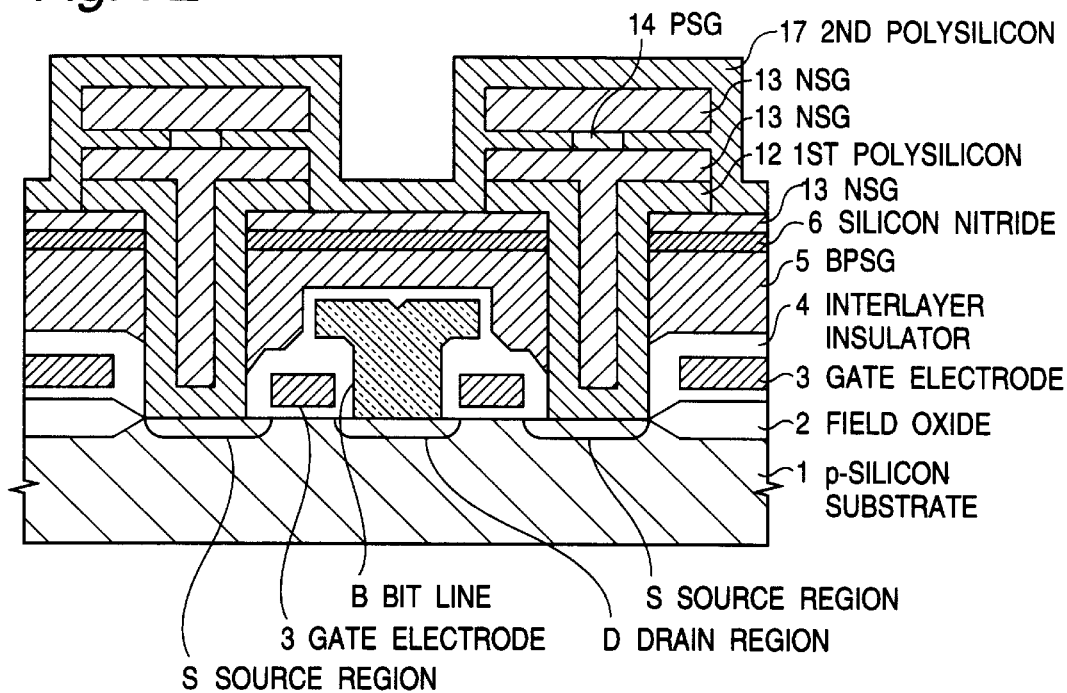
Figure 7F:
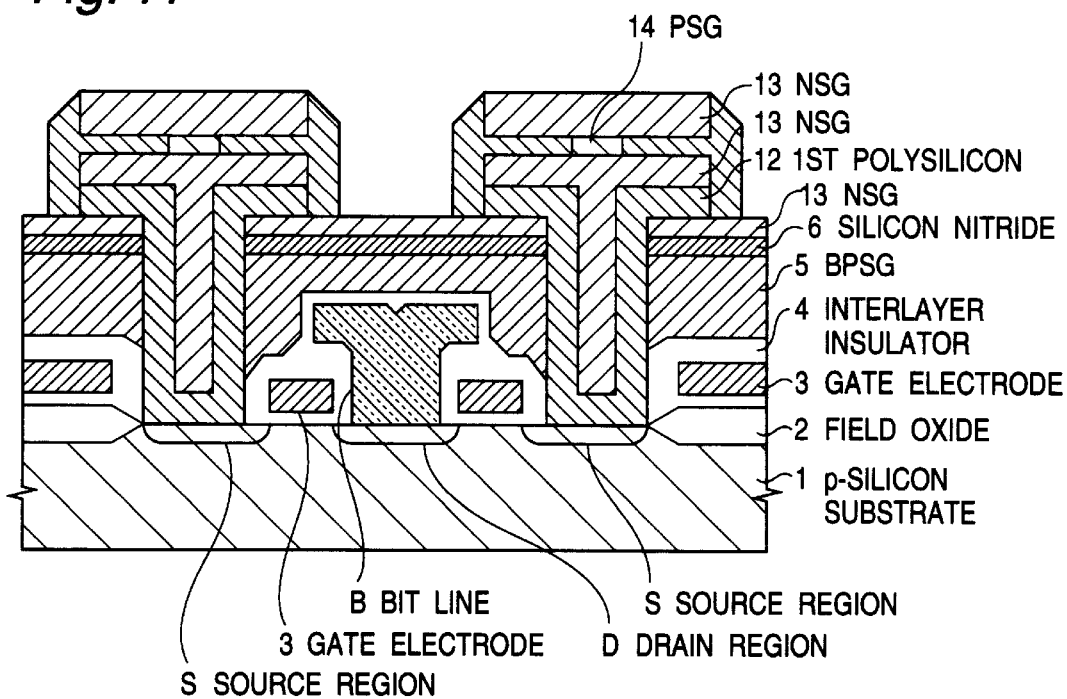

Thereafter, as shown in FIG. 7E, a second polysilicon film 17 is deposited on the whole surface to completely fill the recess 16 by the low pressure CVD, and then, as shown in FIG. 7F, an anisotropic etching is conducted to the whole surface so that a side wall 18 of the second polysilicon film 17 is formed on a side surface of the patterned stacked structure of the first polysilicon layer 12 and the three-layer oxide film 13+14+13.

Figure 7G:
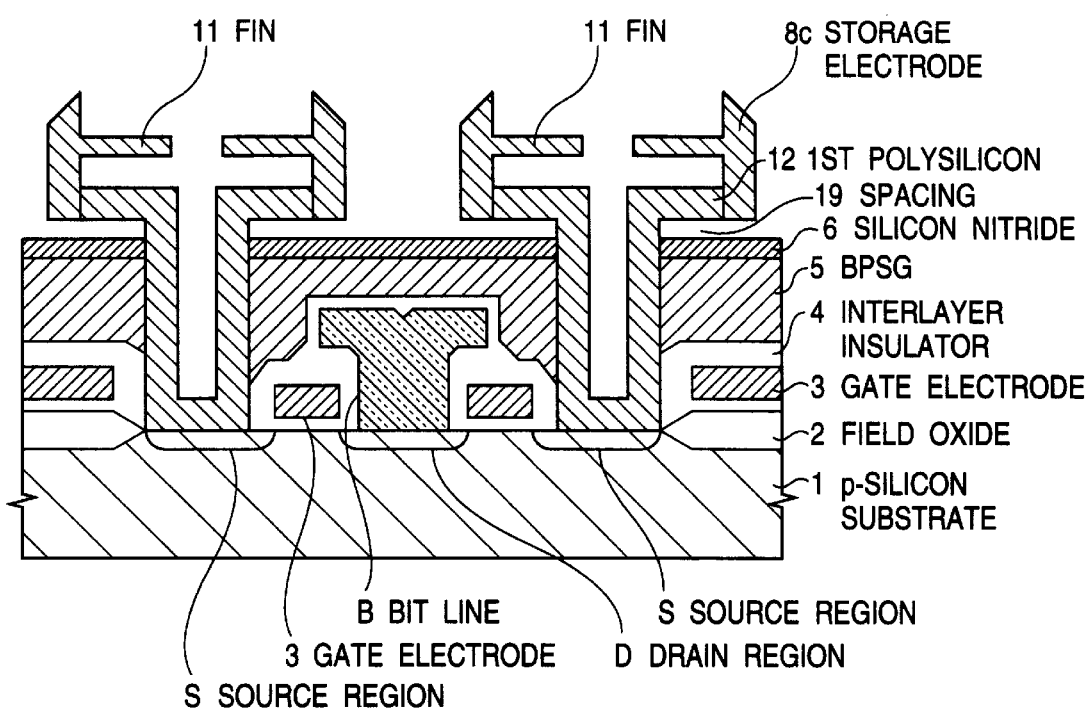

Then, the NSG film 13, the PSG film 14 and the NSG film 13 of the three-layer oxide film and the NSG film 13 formed on the silicon nitride film 6, are removed by an ammon fluoride (ammonium fluoride) solution and the DHF solution, so that, the storage electrode 8c formed of the first polysilicon film 12 and the second polysilicon film 17 is exposed as shown in FIG. 7G, and the spacing 19 of a predetermined distance is formed between the upper surface of the silicon nitride film 6 and the bottom surface of a cylindrical storage portion 8c positioned above the upper surface of the silicon nitride film 6 and having an outer size larger than the inner size of the capacitor contact hole 17.

The storage electrode 8a thus formed has the fin 11 which is formed by the second polysilicon film 17 entering into the recess 16 and which is integral with the storage electrode 8c. This fin 11 projects horizontally from an inner surface of the cylindrical portion toward a center axis of the cylindrical portion. Namely, the fin 11 is in the form of a ring extending along the inner circumference of the cylindrical portion one turn.

This third embodiment is different from the first embodiment in that the spacing 19 of a predetermined distance is formed between the upper surface of the silicon nitride film 6 and the bottom surface of a cylindrical storage portion 8c.

Thereafter, as shown in FIG. 6, a dielectric material film 9 is formed on the whole surface, and then, a third polysilicon film is deposited on the whole surface and patterned to form the plate electrode 10 of the stacked capacitor. Thus, the capacitor structure of the DRAM is completed.

The third embodiment of the semiconductor memory in accordance with the present invention has the following advantages, since it is manufactured by the above mentioned process.

In the cylindrical storage electrode 8c, not only since the fin 11 is formed on the inside of the cylindrical storage electrode, similarly to the first embodiment, but also since the bottom surface of the cylindrical storage electrode 8c can be utilized as the surface area of the storage electrode, the effective surface area is increased as compared with the first embodiment, so that the storage capacitance can be correspondingly increased. In addition, since the effective surface area is larger than that of the prior art cylindrical storage electrode having no fin, the storage capacitance can be correspondingly increased. Furthermore, since the annular fin 11 is formed on the inside of the cylindrical storage electrode 8a, the strength of the side wall 18 can be elevated.

In addition, since the fin is formed integrally with the side wall 18 at the same time as the side wall 18 is formed, no natural oxide film exists at a boundary between the side wall 18 and the fin 11, and therefore, a capacitor having a high reliability can be obtained.

In the above mentioned embodiments, the present invention has been applied to the semiconductor memory having the stacked capacitor. However, the present invention is in no way limited to the above mentioned embodiments, but can be applied to other semiconductor memories and other semiconductor devices which can effectively utilize the present invention.

Furthermore, the number, the position and the shape of various constituents included in the above mentioned embodiments are in no way limited to the details of the above mentioned embodiments, but can be freely selected in embodying the present invention. For example, the cylindrical storage electrode is not limited to a circle in section but can be an oval, a square, or a rectangle in section.

As seen from the above, the semiconductor device in accordance with the present invention is characterized in that one horizontal projection or a plurality of horizontal projections separated from each other in a vertical direction, are formed on an inner surface of the cylindrical storage electrode. Therefore, the surface area of the storage electrode is increased by the surface area of the projection or projections, so that the storage capacitance for storing the electric charge can be correspondingly increased.

In addition, if a spacing is formed between the bottom surface of the cylindrical storage electrode and the upper surface of the underlying insulating film, the area of the bottom surface of the cylindrical storage electrode contributes the increase of the surface area of the storage electrode. Therefore, the storage capacitance can be correspondingly increased.

Therefore, it is possible to increase the storage capacitance without heightening the cylindrical storage electrode. Accordingly, it is no longer necessary to heighten the cylindrical storage electrode, which was necessary in the prior art in order to increase the storage capacitance. As a result, it is possible to avoid the absolute step difference between the memory cell zone and the peripheral circuit zone from becoming large for the purpose of increasing the storage capacitance, and therefore, it is also possible to prevent the patterning of the overlying wiring layer extending on both the memory cell zone and the peripheral circuit zone, from becoming difficult.

Furthermore, since the projection is formed on the inside of the cylindrical storage electrode, integrally with the side wall of the cylindrical storage electrode, the strength of the side wall can be elevated. Accordingly, it is possible to avoid the prior art problem that the higher the height of the cylindrical storage electrode is, the weaker the cylindrical storage electrode becomes, and finally, there occurs possibility that the side wall of the cylindrical storage electrode collapses.

Moreover, in the method in accordance with the present invention for manufacturing the semiconductor device, since the projection is formed integrally with the side wall of the cylindrical storage electrode at the same time as the side wall of the cylindrical storage electrode is formed, no natural oxide film exists at a boundary between the side wall and the projection, and therefore, a capacitor having a high reliability can be obtained.

At the time of forming the projection, for selectively removing the intermediate layer sandwiched between the upper and lower layers of the multi-layer insulating film, the etching agent having the etch rate of the intermediate layer higher than that of the other layers is used. The hydrofluoric acid solution is used as this etching agent, so that the intermediate layer is etched at the etching rate faster than that of the other layers, and therefore, the intermediate layer can be retracted to a suitable extent.

In this connection, the second insulating film is formed of silicon nitride. Since the silicon nitride is not dissolved by the hydrofluoric acid solution, even if the above mentioned etching is conducted after the second insulating film is formed, the second insulating film is not dissolved, so that an insulating film necessary for the semiconductor device can be caused to remain.

The invention has thus been shown and described with reference to the specific embodiments. However, it should be noted that the present invention is in no way limited to the details of the illustrated structures but changes and modifications may be made within the scope of the appended claims.

What is claimed is:

1. A method for manufacturing a semiconductor device, comprising the steps of:

forming a first insulating film on a semiconductor substrate;

forming a second insulating film on the first insulating film;

selectively removing the first insulating film and the second insulating film to form a contact hole to penetrate through the first insulating film and the second insulating film and to expose a portion of the semiconductor substrate;

forming a first conducting layer on the whole surface including an inner surface of the contact hole;

forming a multi-layer insulating film composed of at least three layers, on the whole surface of the first conducting layer;

patterning a stacked structure composed of the first conducting layer and the multi-layer insulating film into a pillar form;

selectively etching the patterned multi-layer insulating film to partially remove and retract an intermediate layer between an upper layer and a lower layer of the multi-layer insulating film so as to form a recess between the upper layer and the lower layer of the multi-layer insulating film;

forming a second conducting layer on the whole surface including an area inside the recess;

etching back the second conducting film by an anisotropic etching, so that a cylindrical side wall formed of the second conducting film is formed on a side surface of the patterned multi-layer insulating film having the recess;

removing the multi-layer insulating film to form a storage electrode formed of the remaining first and second conducting layers;

forming a dielectric film on a surface of the storage electrode, and forming a third conducting layer on the dielectric film as a plate electrode.

2. A method claimed in claim 1 wherein the second insulating film includes a silicon nitride film.

3. A method claimed in claim 1 wherein in the selective etching of the patterned multi-layer insulating film is higher than that of the other layers of the multi-layer insulating film.

4. A method claimed in claim 3 wherein the selective etching of the patterned multi-layer insulating film, is conducted by a wet etching.

5. A method claimed in claim 4 wherein said wet etching uses a hydrofluoric acid solution.

* * * * *